US009673751B2

(12) United States Patent
Dobney

(10) Patent No.: US 9,673,751 B2
(45) Date of Patent: Jun. 6, 2017

(54) ROTATING FURLING CATENARY SOLAR CONCENTRATOR

(71) Applicant: David Timothy Dobney, Toronto (CA)

(72) Inventor: David Timothy Dobney, Toronto (CA)

(73) Assignee: David Dobney, Toronto, Ontario (CA)

( * ) Notice: Subject to any disclaimer, the term of this patent is extended or adjusted under 35 U.S.C. 154(b) by 287 days.

(21) Appl. No.: 14/270,113

(22) Filed: May 5, 2014

(65) Prior Publication Data
US 2015/0318820 A1 Nov. 5, 2015

(51) Int. Cl.
*H01L 31/054* (2014.01)
*H02S 40/22* (2014.01)
(Continued)

(52) U.S. Cl.
CPC ............... *H02S 20/30* (2014.12); *F24J 2/145* (2013.01); *F24J 2/4638* (2013.01); *F24J 2/5406* (2013.01);
(Continued)

(58) Field of Classification Search
CPC .......... H02S 40/22; H02S 40/40; H02S 40/42; H02S 40/425; H02S 40/20; H02S 30/20;
(Continued)

(56) References Cited

U.S. PATENT DOCUMENTS 4,078,549 A * 3/1978 McKeen ............... F24J 2/14
126/606

4,119,365 A * 10/1978 Powell ............... F24J 2/145
126/684

(Continued)

FOREIGN PATENT DOCUMENTS

CA WO 2004042828 A2 * 5/2004 ......... F28D 15/0266
DE WO 2011012917 A1 * 2/2011 ............ H02S 40/44
(Continued)

OTHER PUBLICATIONS

Huff, et al. "Design of a Radiator Shade for Testing in a Simulated Lunar Environment". NASA-CR-192080 (Spring 1992).*
Machine translation of Laurent, FR 2421347 A2.*

*Primary Examiner* — Allison Bourke
*Assistant Examiner* — William E McClain

(57) ABSTRACT

The present invention relates to a rotating solar concentrating device wherein reflective sheets hung in a catenary trough shape capable of solar concentration may be protectively furled and balanced and rotated about a vertical axis. The reflective sheets may be furled to protect them from damage from wind, rain, and dust. In some embodiments, rotating parts of the device may be hung from supports above. In some embodiments, a furling mechanism may initiate protective furling in response to damaging environmental factors. Some embodiments may concentrate light on a photovoltaic cell wherein the photovoltaic cell is cooled by immersion in a heat pipe. In some embodiments, reflective surfaces may be supported by cables that are tensioned by a hanging, rotating ballast. In some embodiments, the device may be employed in a ganged array. In some embodiments, the invention may harvest wind energy as a vertical axis wind turbine (VAWT).

17 Claims, 17 Drawing Sheets

(51) Int. Cl.
  *H02S 30/20* (2014.01)
  *H02S 20/30* (2014.01)
  *F24J 2/14* (2006.01)
  *F24J 2/46* (2006.01)
  *F24J 2/54* (2006.01)
  *H01L 31/052* (2014.01)
  *F24J 2/52* (2006.01)

(52) U.S. Cl.
  CPC ....... *H02S 40/22* (2014.12); *F24J 2002/5286* (2013.01); *H01L 31/0521* (2013.01); *H01L 31/0547* (2014.12); *Y02E 10/45* (2013.01); *Y02E 10/47* (2013.01); *Y02E 10/52* (2013.01)

(58) Field of Classification Search
  CPC ... H02S 20/30; F24J 2/0015; F24J 2/06; F24J 2/10–2/18; H01L 31/054; H01L 31/0547
  See application file for complete search history.

(56) References Cited

U.S. PATENT DOCUMENTS

| | | | | |
|---|---|---|---|---|
| 4,146,407 A * | 3/1979 | Litsenko | ............... | G02B 3/12 136/246 |
| 4,236,399 A * | 12/1980 | Williams | ............... | C21D 1/30 72/295 |
| 4,546,757 A * | 10/1985 | Jakahi | ............... | F24J 2/07 126/604 |
| 4,719,903 A * | 1/1988 | Powell | ............... | F24J 2/145 126/680 |
| 5,851,309 A * | 12/1998 | Kousa | ............... | F24J 2/0444 126/578 |
| 5,885,367 A * | 3/1999 | Brown | ............... | B64G 1/222 136/245 |
| 6,237,241 B1 * | 5/2001 | Aaron | ............... | B25J 17/0266 33/268 |
| 2008/0168981 A1 * | 7/2008 | Cummings | ............... | F24J 2/5241 126/600 |
| 2009/0145474 A1 * | 6/2009 | Pang | ............... | H01L 31/0547 136/248 |
| 2009/0308377 A1 * | 12/2009 | Kleinwaechter | ............... | A01G 9/243 126/605 |
| 2010/0058703 A1 * | 3/2010 | Werner | ............... | F16C 13/04 52/645 |
| 2010/0163014 A1 * | 7/2010 | Johnson | ............... | F24J 2/14 126/573 |
| 2010/0206379 A1 * | 8/2010 | Littau | ............... | F24J 2/06 136/259 |
| 2010/0236539 A1 * | 9/2010 | Lee | ............... | F24J 2/12 126/600 |
| 2011/0041894 A1 * | 2/2011 | Liao | ............... | F24J 2/14 136/246 |
| 2011/0232630 A1 * | 9/2011 | Tsao | ............... | F03D 9/007 126/600 |
| 2012/0273026 A1 * | 11/2012 | Chatterjee | ............... | H02S 40/44 136/248 |
| 2013/0306135 A1 * | 11/2013 | Planting | ............... | G02B 7/183 136/246 |

FOREIGN PATENT DOCUMENTS

| | | | | |
|---|---|---|---|---|
| FR | 2421347 A2 * | 10/1979 | ............. | F24J 2/1057 |
| FR | WO 2008094555 A2 * | 8/2008 | ............. | F24J 2/202 |
| GR | WO 2012042407 A2 * | 4/2012 | ............. | F24J 2/145 |
| TR | WO 2011134759 A2 * | 11/2011 | ............. | F24J 2/07 |

* cited by examiner

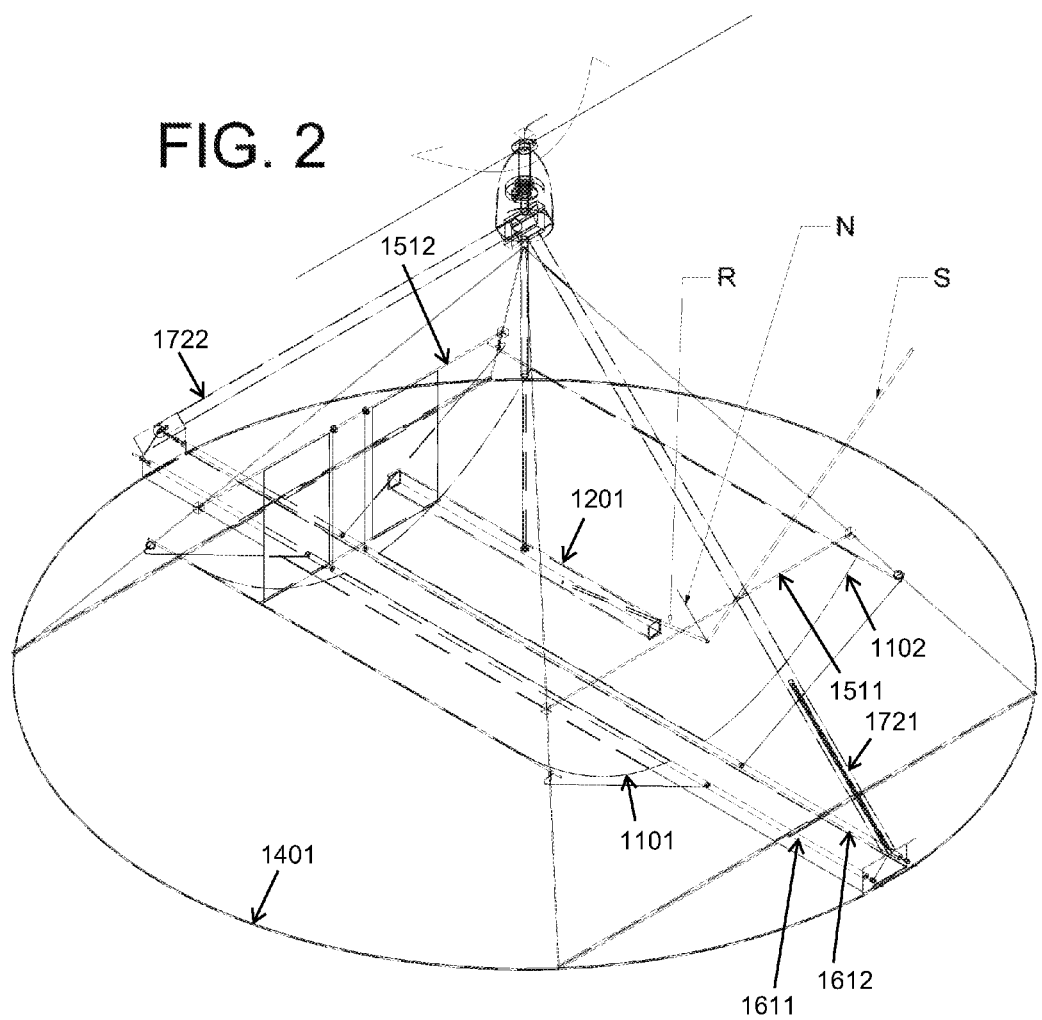

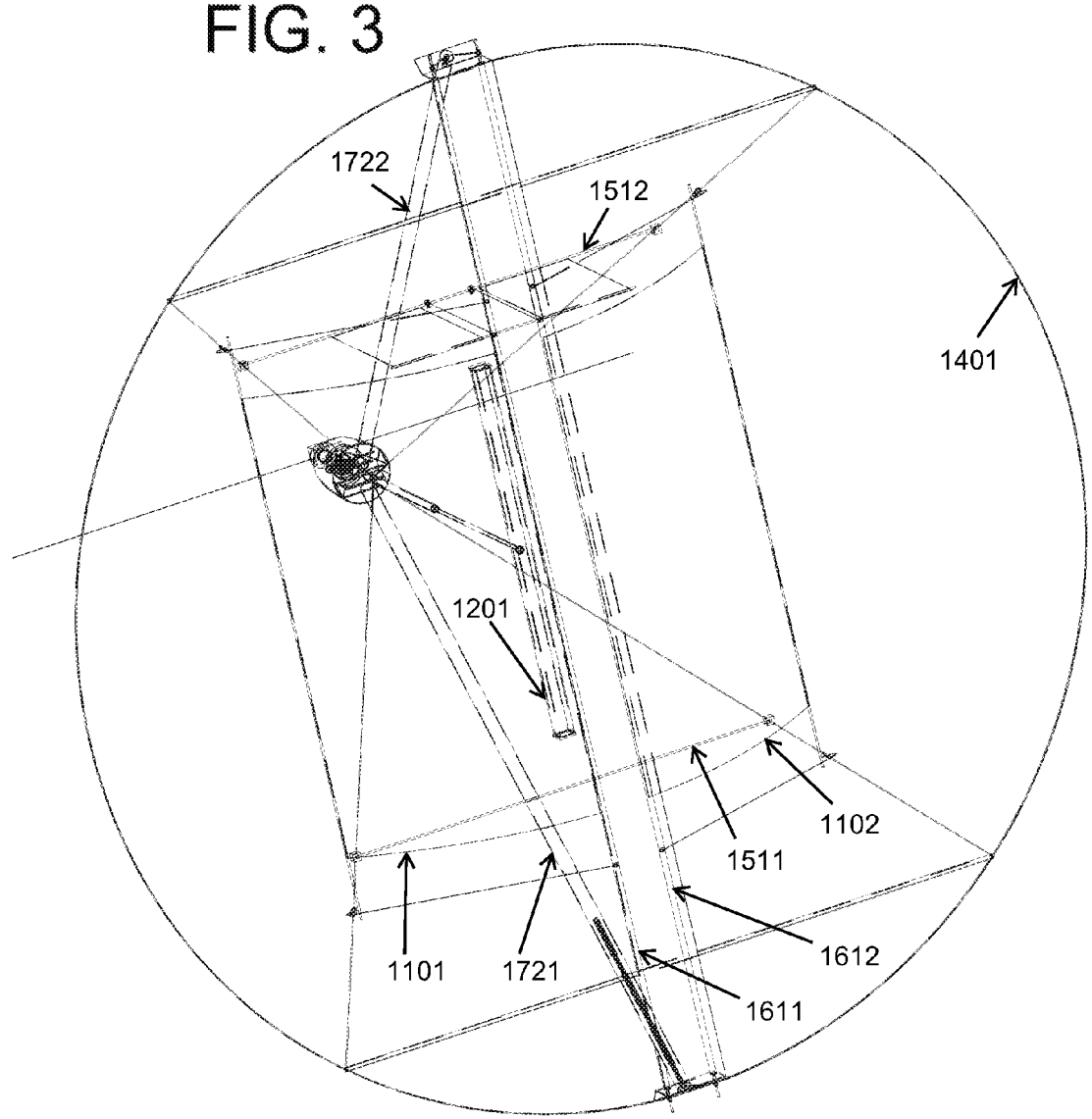

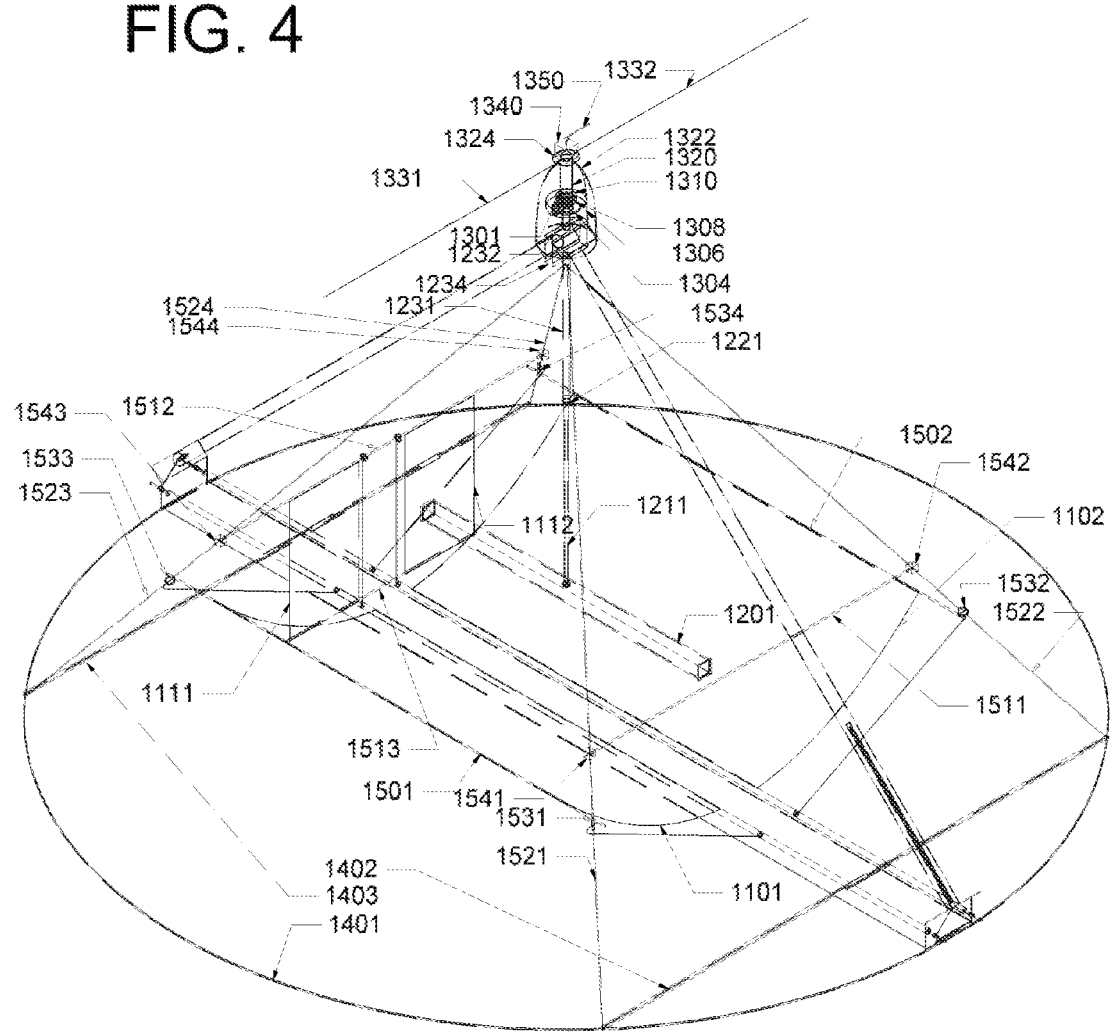

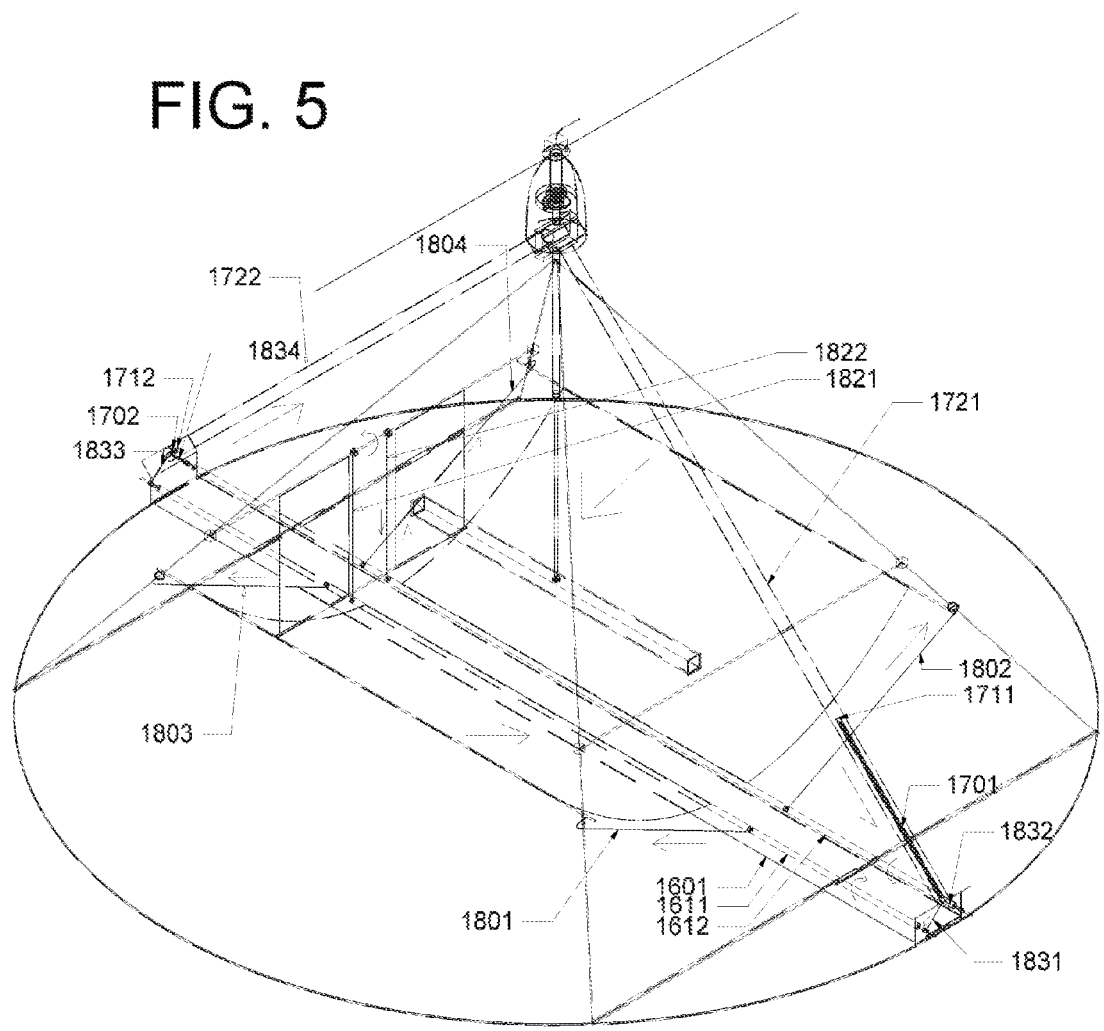

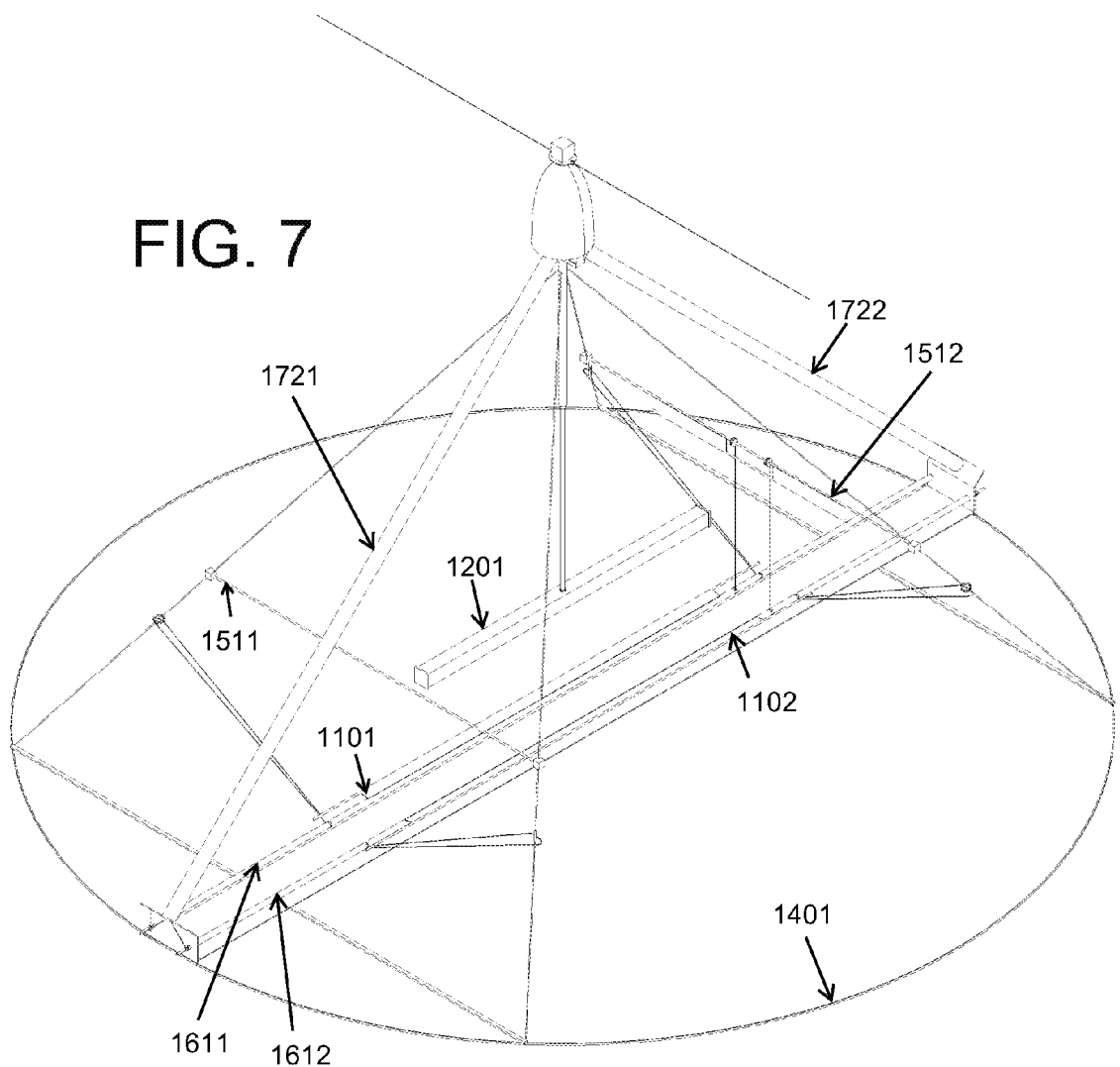

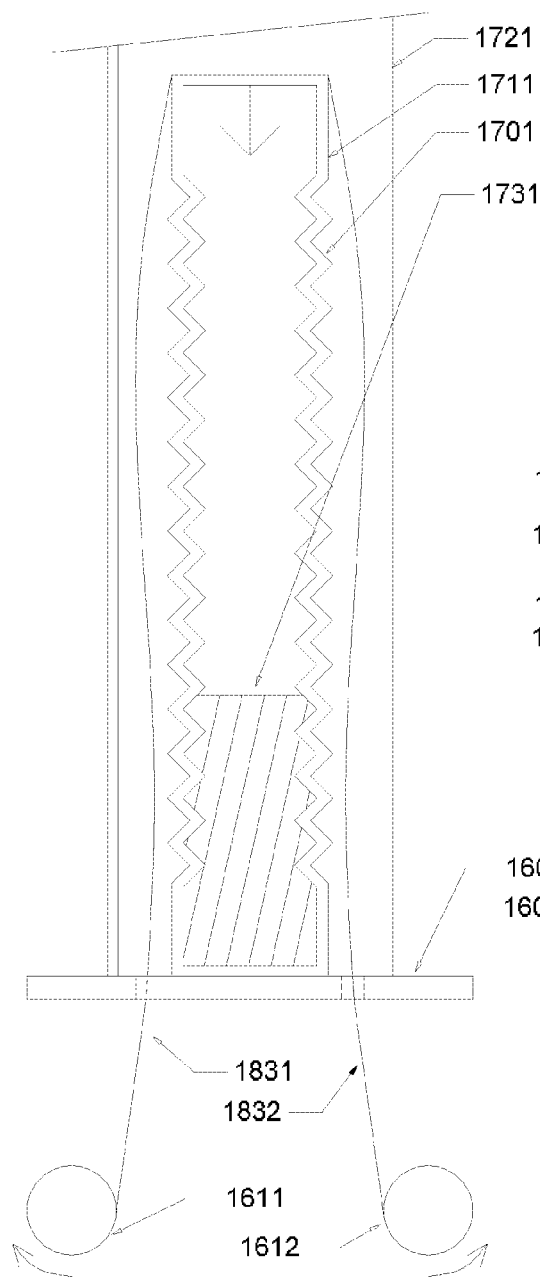
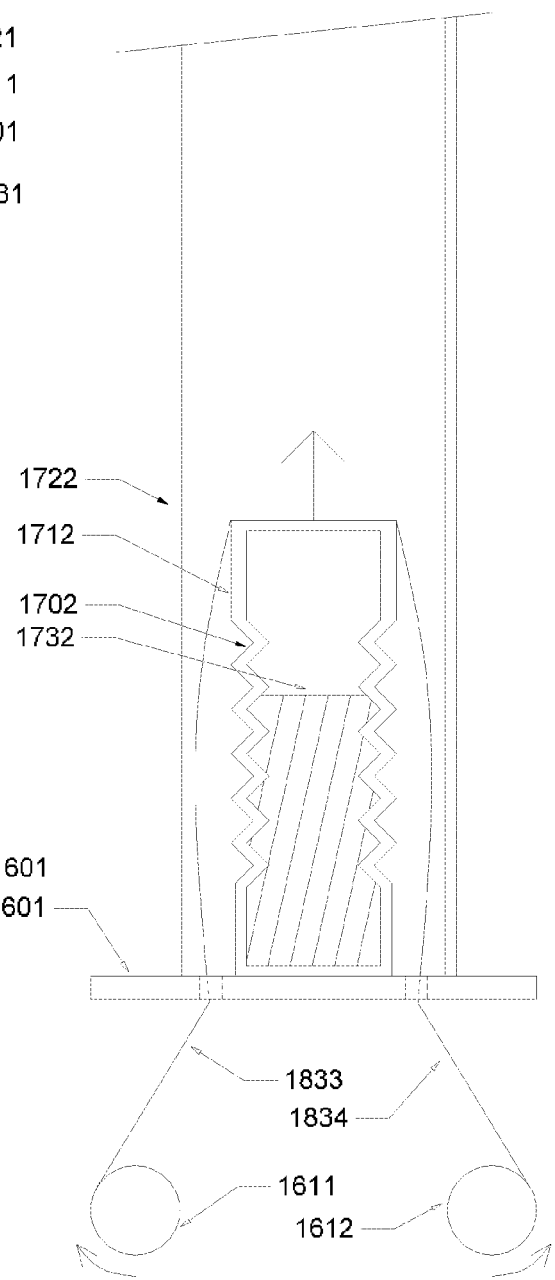

ROTATING FURLING CATENARY SOLAR CONCENTRATOR

BACKGROUND OF THE INVENTION

The present invention relates to a hanging, rotating solar concentrating device wherein reflective sheets of the device are protectively furled. The present invention employs reflective sheets that are hung to form a catenary trough capable of concentrating light. The reflective sheet elements of the present device may be furled, to protect them from damage in wind, rain, or dust. The present device may concentrate light on a photovoltaic cell, thus generating electricity and heat at the photovoltaic cell. Embodiments of the present invention may include a novel means for removal of heat from the photovoltaic cell. The present device is balanced about its vertical axis of rotation, thus requiring minimum power to rotate. Some solar concentrating devices of the prior art will now be described and contrasted to the present invention.

In U.S. Application US 20100058703, Werner and Funai describe a reflective parabolic trough scheme that is commonly employed in the prior art, wherein a reflective trough element is parabolic, supported from underneath, and rotated about an axis that is coincident with the focal line of the trough, which is horizontal. Such a system requires a rigid, expensive reflective element and a strong, expensive structure to withstand wind, as well as floor area dedicated to the device. The present invention includes a reflective trough element that is catenary and is and rotated about a vertical axis.

In U.S. application Pat. No. 4,236,399, Williams and Skaggs present a method of forming a parabolic solar concentrating metal trough. Metal troughs are commonly used in the prior art, and are relatively heavy and expensive and require a heavy supporting structure. The present invention employs a solar concentrating trough that is made of less expensive and lighter materials than troughs typical of the devices described in U.S. Pat. No. 4,236,399. The present invention forms a solar concentrating trough in a simpler method than the method of U.S. Pat. No. 4,236,399 (i.e. —the present invention forms a solar concentrating trough by gravity).

In U.S. Application 20100206379, Littau, Maeda, and Cheung present an embodiment of a concentrating device that includes a parabolic reflector that is mounted on a rotating frame that may rotate about a vertical axis wherein the frame is supported from below (i.e. —the frame is supported from underneath). Such a device employs an expensive parabolic trough element. Such a device requires a strong, expensive structure to withstand wind, and floor area dedicated to the device. The surface upon which the frame is mounted must be level and/or prepared for the application. The present invention includes a catenary reflector that is mounted on a rotating frame that rotates about a vertical axis. Embodiments of the present invention may include a rotating frame that is hung from above.

In PCT Application WO2012042407, Adigiouzel and Kourtis present an embodiment of a concentrating device that includes a catenary reflector that is mounted on a rotating frame that may rotate about a vertical axis that is supported by wires, wherein the reflective surfaces of the device are comprised of strips that are interleaved in order to minimize wind load. Although an interleaved surface encounters a lower wind load than a non-interleaved surface, interleaving does not lessen wind load sufficiently to prevent damage to reflective surfaces by wind, nor does it protect reflective surfaces from damage by moisture and dust; thus the device of WO2012042407 cannot be practically employed. The present invention includes a catenary reflector that is protectively furled. During furling, reflective surfaces that are lightweight and inexpensive may be fully protected from wind, moisture, and dust.

In U.S. Pat. No. 6,237,241, Aaron and Nock present various concentrators that are hung from wires. The concentrators presented in U.S. Pat. No. 6,237,241 do not include catenary reflectors. The concentrators presented in U.S. Pat. No. 6,237,241 are subject to wind damage and transfer of wind loads. The present invention includes a catenary reflector that is protectively furled, that is not susceptible to wind damage, and transfers minimal wind load to the supporting structure when furled.

In U.S. Pat. No. 5,851,309, Kousa presents a catenary concentrator that does not rotate. Light is reflected by vertical "directing" reflectors to the stationary catenary reflector. Such a system requires expensive and numerous "directing" reflectors and causes the catenary reflector to be inefficient due to shading and cosine losses. In U.S. Pat. No. 5,851,309, reflective surfaces of the device are protected in two ways. One method of protection involves housing the reflective surface inside a transparent structure. The other method of protection involves building the device from strong materials. Both protection methods presented in U.S. Pat. No. 5,851,309 are expensive. The present invention uses an inexpensive method (i.e. —furling) to protect reflective surfaces. In U.S. Pat. No. 5,851,309, a catenary reflective surface is partially spooled and unspooled from a roller to achieve an adjustment of focal length. In the present invention, a catenary reflective surface is fully spooled and unspooled from a spool to achieve protection of reflective surfaces and to effect minimization of wind load transfer to the supporting structure.

In U.S. Application Pat. No. 5,885,367, Brown and Whalen present a device including reflector panels that are wrapped around booms. The device of U.S. Pat. No. 5,885,367 includes planar reflective elements that are wrapped to conserve space during transport in spacecraft. The present invention includes catenary reflective elements that are protectively wrapped and intended for terrestrial applications. The wrapped reflective surfaces of the device of U.S. Pat. No. 5,885,367 are unwrapped only once during operation (i.e.—after launch). The wrapped reflective surfaces of the present invention are wrapped, unwrapped, rewrapped, etc. many times over the course of use. The wrapped reflective surfaces of the device of U.S. Pat. No. 5,885,367 are unwrapped by manual actuation. In some embodiments of the present invention, reflective surfaces may automatically wrap in response to damaging environmental factors, and un-wrap in response to favourable environmental factors.

In NASA document NASA-CR-192080, Huff, Remington, and Tang present a reflector intended for lunar applications that includes a catenary reflective surface that is partially spooled and unspooled from a roller to achieve an of adjustment of focal length, wherein the reflector assembly is supported from underneath. In the present invention, a catenary reflective surface is fully spooled and unspooled from a spool to achieve protection of reflective surfaces and minimization of wind load transfer to associated structures. In some embodiments of the present invention, rotating parts may be supported from above.

In European application EP 2111520, Diemunsch presents a device for removal of heat from a photovoltaic cell wherein the photovoltaic cell is mounted on a water cooled block. Such a heat removal method requires an auxiliary fluid delivery system. Such a device is difficult to incorporate into a rotating receiver/concentrator. Diemunsch also refers to the inefficient prior art method commonly used to remove heat from photovoltaic cells, wherein the photovoltaic cell includes an aluminum heat sink heat exchanger surface on the back of the photovoltaic cell. In the present invention the photovoltaic cell is immersed directly in a boiling cooling medium thus allowing efficient transfer and obviating an external circulation system.

In PCT application WO2004042828, Osipov, G. Rubin, and L. Rubin present a device that includes a photovoltaic cell that is cooled by a heat pipe. The heat pipe is attached to "a heat transfer surface" of the photovoltaic (i.e.—the heat pipe is external to the photovoltaic cell). The heat transfer rate of such a system is limited by conductivity at the "heat transfer surface". The heat transfer rate of such a system is limited by the available "heat transfer surface" area (i.e.—the "back" of the photovoltaic cell). The photovoltaic cooling method of the present invention differs from PCT application WO2004042828 in that the photovoltaic cell that is immersed in a heat pipe. All surfaces of the photovoltaic cell of the present invention are in contact with the cooling medium.

In PCT application 2011012917, F. Flechsig, Voegeli, and T. Flechsig, present a device that includes a photovoltaic that is cooled by a vapourizing fluid wherein photovoltaic wafers are glued to a heat exchanger carrying the vapouizing fluid. The present invention differs from PCT application 2011012917 in that it includes a photovoltaic cell that is immersed in a heat pipe.

In PCT application WO2011134759, Capan discloses a solar trough system that rotates about its focus and includes counterweights to the reflective trough and related parts, so as to minimize the energy required to rotate reflective parts. The present invention includes parts that are either balanced about the axis of rotation, or counter-weighted by congruent parts. The device of WO2011134759 rotates about a horizontal axis. The present invention rotates about an axis of rotation is about a vertical. The counterweights of WO2011134759 provide one function only (i.e.—to provide counter-weight). Such a system includes expensive counterweights that serve no function other than balancing useful parts. "Congruent part" counterweights of the present invention provide two functions; to provide counter-weight as well as to provide a function as component of either the solar concentration means, the furling means, the furling mechanism, the balancing of parts about the central vertical axis, the immersed photovoltaic heat pipe receiver design, the supporting means, the positioning means, or the ballast of the device.

BRIEF SUMMARY OF THE INVENTION

The present invention relates to a rotating solar concentrating device wherein reflective sheets form a catenary trough shape and may be protectively furled. Catenary reflectors may be made of lightweight material and supported by a lightweight frame. The catenary reflector concentrates light along a rotating line focus. The catenary reflector may be supplemented with a planar reflector to improve concentration. An inexpensive, flexible, reflective sheet or film may be used to form the catenary reflector. Gravity causes a flexible sheet to form a catenary shape when hung.

The catenary trough reflector is balanced and rotated about a vertical axis. The device includes parts that are either balanced about the vertical axis of rotation, or counterweighted by congruent parts about the vertical axis of rotation. Thus, parts of the device are easy to rotate, and are efficiently employed in multiple uses (i.e.—as counterweight and other uses).

The reflective elements of the present device may be furled, to protect them from damage from wind, rain, and dust. This is a less expensive, more reliable, more practical means of protection when compared to the devices of the prior art. The furling of reflective elements also minimizes the transfer of wind loads to supporting structures of the device during windy conditions (i.e.—when in a furled state, the surface area of parts exposed to wind is substantially reduced).

In some embodiments of the invention, rotating parts of the device may be hung from a supports above. When the device is hung, it does not require a dedicated ground area for use. When the device is hung, it is easy to install and does not require ground preparation, leveling, etc.

In some embodiments of the present invention, an inexpensive furling mechanism may initiate protective furling of reflective surfaces consistently and automatically in response to damaging environmental factors (i.e.—wind, shade, lack of tracking), and unfurling in response to favourable environmental factors (i.e.—sunny windless conditions). The furling mechanism may employ a mechanism that exploits temperature/vapour pressure differences, which are caused by sun exposure differences, to simply and reliably actuate the furling/un-furling of reflective surfaces.

Embodiments of the present invention may concentrate light on a photovoltaic cell (at its line focus), thus generating electricity and heat at the photovoltaic cell. Embodiments of the present invention may include a novel means for removal of heat from the photovoltaic cell, for the purpose of protecting and improving the efficiency of the photovoltaic cell. The method of cooling of the photovoltaic cell involves immersion of the photovoltaic cell in a heat pipe. Such a cooling system is reliable, lightweight, inexpensive, and easily incorporated into a rotating concentrator.

Reflective surfaces of the present invention may be supported by cables that are tensioned by a hanging, rotating ballast. The rotating ballast may be made of an inexpensive material and implemented in a shape that is easy to fabricate. The ballast is less expensive than the rigid complex support frames of devices of the prior art.

The present invention may be implemented in a ganged array. The elements of the ganged array may be linked (and hung) by common cables. The elements of the array may be appropriately positioned relative to each other simply by hanging them by common positioning/supporting cables. When such a ganged array is hung, neither adjustments nor additional framework are required to appropriately position elements of the array relative to each other and the common positioning means. Such is not the case for "ground-supported" ganged arrays of the prior art. When implemented in a ganged system, large reflector arrays may be installed by expending a relatively minor amount of labour.

In some embodiments of the present invention, the device may harvest wind energy. In such embodiments, the device may provide power more consistently and more economically than "wind-only" or "solar-only" devices (i.e.—typically wind energy is harvested when solar energy can't be harvested and solar energy is harvested when wind energy can't be harvested). When the reflective surfaces of the device are furled, blades of the device may act as a vertical axis wind turbine (VAWT).

DESCRIPTION OF THE DRAWINGS

FIG. 2 shows the first embodiment of the invention from above when unfurled, with direction of rotation indicated, with a typical ray trace shown FIG. 3 shows the first embodiment of the invention when unfurled, as seen from an alternate location above FIG. 4 shows the first embodiment of the invention when unfurled, as seen from above, with various parts numbered FIG. 5 shows the first embodiment of the invention when unfurled, as seen from above, with various parts numbered, with arrows indicating the direction of movement of various parts during furling FIG. 7 shows the first embodiment of the invention when furled, as seen from an alternate location above FIG. 9A shows a conceptual section of parts related to the furling mechanism of the first embodiment, with various parts numbered, with arrows indicating the direction of movement of various parts during furling FIG. 9B shows another conceptual section of parts related to the furling mechanism of the first embodiment, with various parts numbered, with arrows indicating the direction of movement of various parts during furling

DETAILED DESCRIPTION OF EMBODIMENTS OF THE INVENTION

Four exemplary embodiments of the invention will be described (i.e.—the first exemplary embodiment, the second exemplary embodiment, the third exemplary embodiment, and the fourth exemplary embodiment). All figures are illustrative and conceptual rather than exact and are prepared for the purpose of illustrating the function of the invention. The embodiments described are not necessarily the preferred embodiments of the invention; the embodiments are shown for the purpose of clarifying design aspects of the invention.

Figure 1:
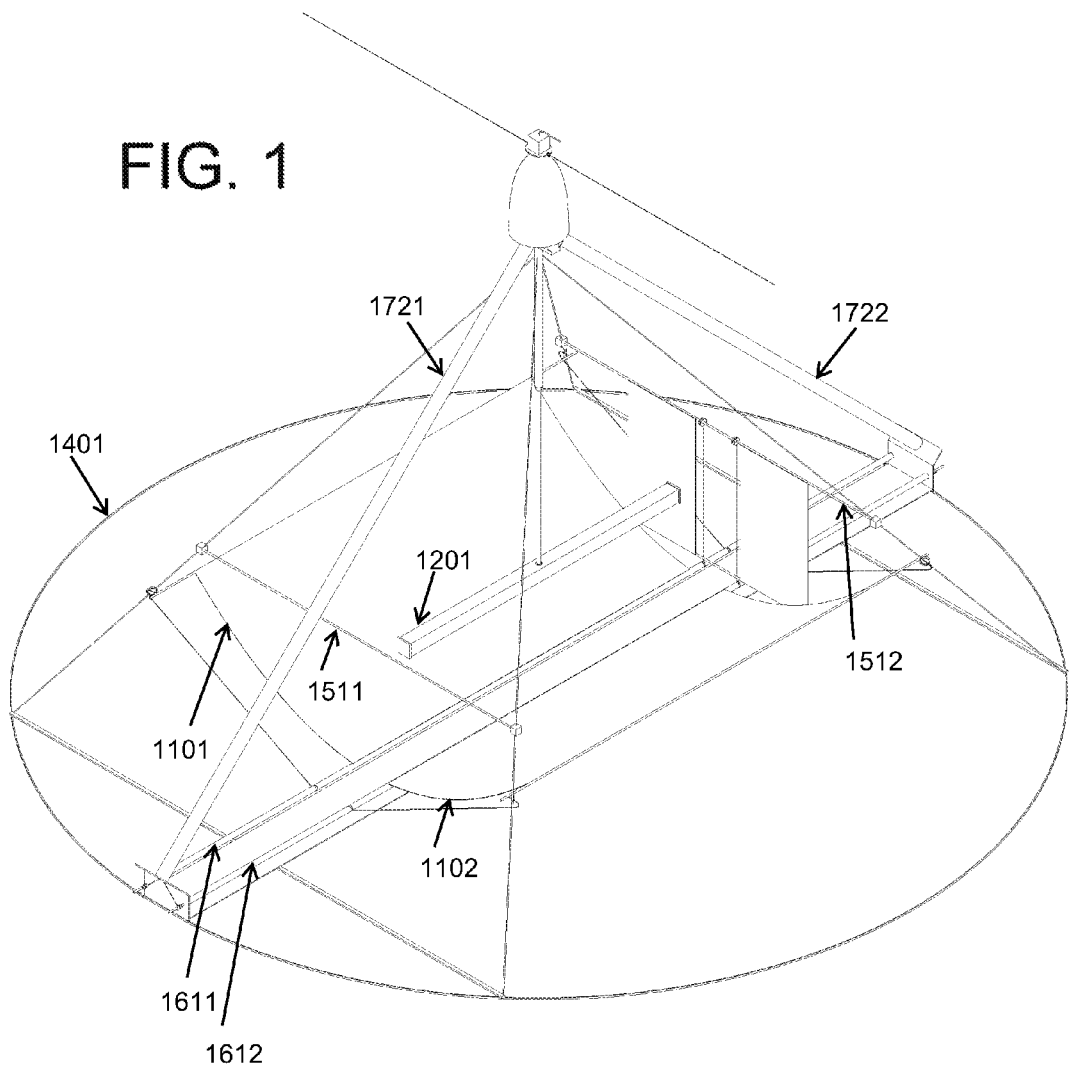
FIG. 1 shows the first embodiment of the invention when unfurled, as seen from above

The first embodiment is shown in FIG. 1, 2, 3, 4, 4A, 4B, 5, 5A, 6, 6A, 7, 8A, 9A, 9B. The first embodiment is shown in an unfurled state in FIG. 1, 2, 3, 4, 5. When in an unfurled state, the first embodiment may be used to collect solar energy. The first embodiment is shown in a furled state in FIG. 6, 7. When in a furled state, the reflective sheets of the first embodiment are protected from wind, moisture, and dust.

Figure 4A:
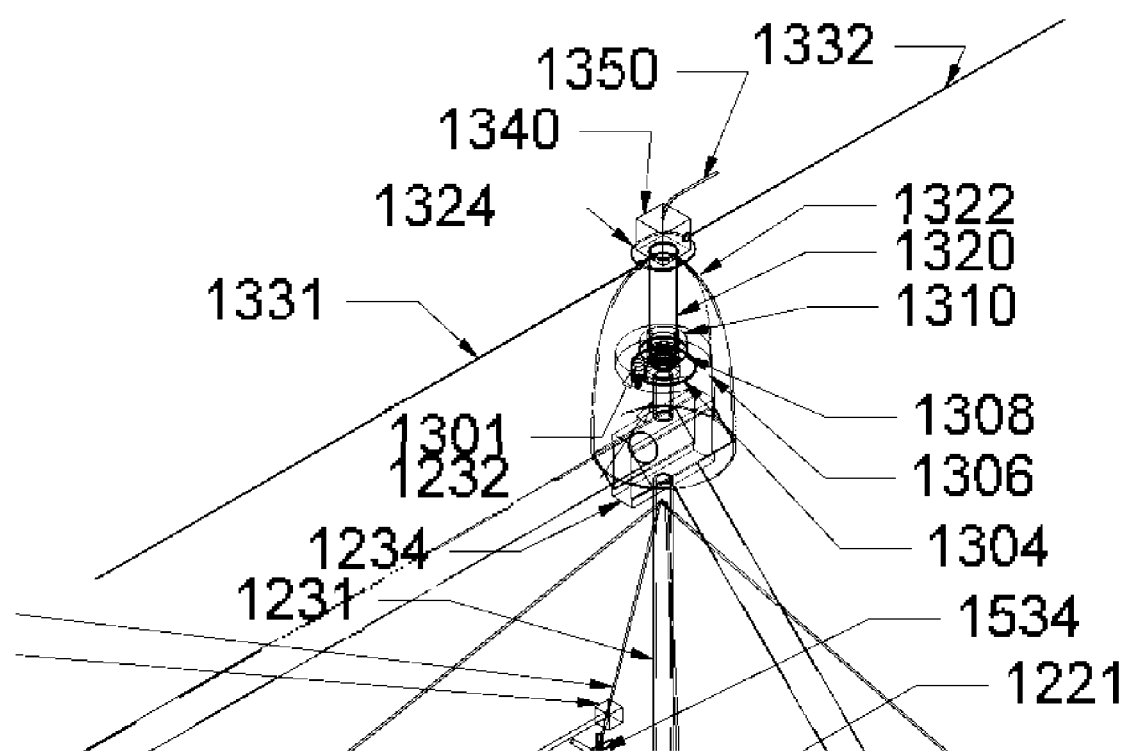
FIG. 4A shows various parts of FIG. 4 in detail
Figure 4B:
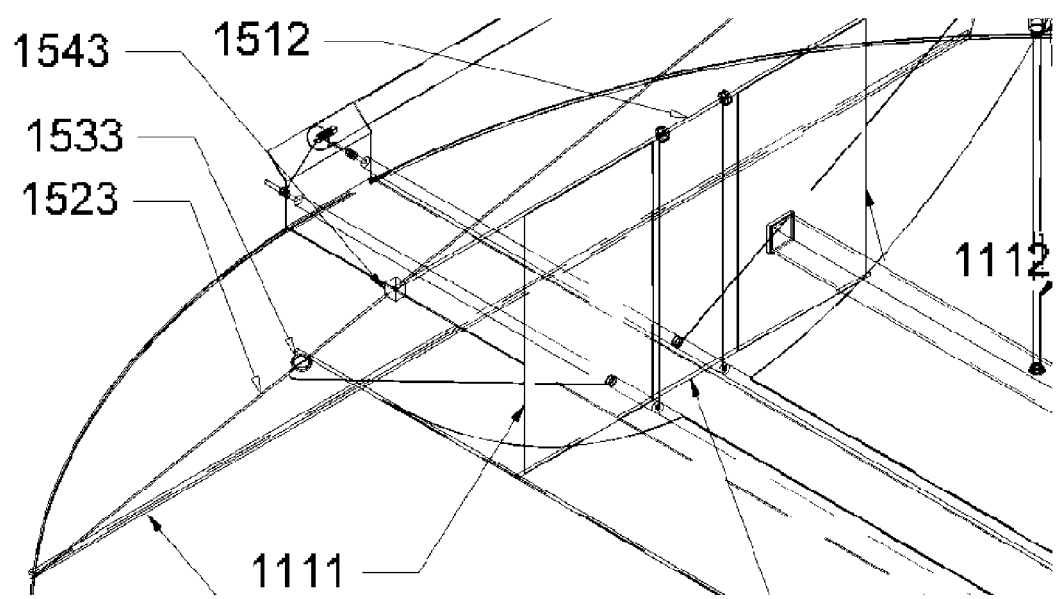
FIG. 4B shows various parts of FIG. 4 in detail
Figure 5A:
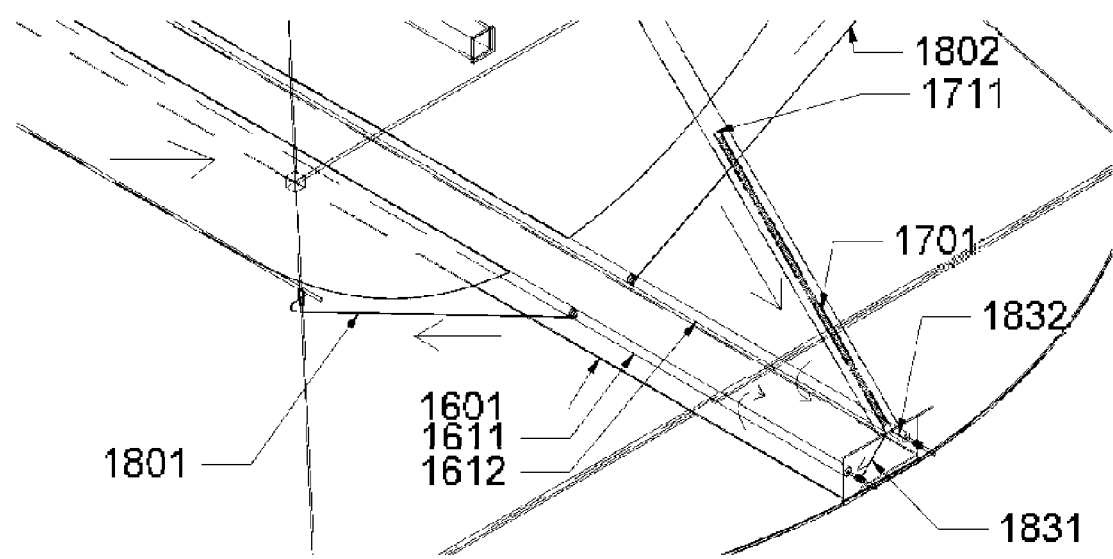
FIG. 5A shows various parts of FIG. 5 in detail

A description of the solar concentrating function of the first embodiment will now be given with reference to FIG. 2 and FIG. 4. When positioned appropriately by the positioning means, the first embodiment is capable of solar concentration, as shown in FIG. 2. To achieve solar concentration, the positioning means rotates the reflective sheets of the first embodiment about the central vertical axis in the direction indicated by the arrow at the top of FIG. 2 (further description of the central vertical axis will be provided later in this specification). Thus the device employs single-axis tracking to achieve concentration. To achieve solar concentration, the positioning means orients the first embodiment such that the focal line of left primary sheet 1101, the focal line of right primary sheet 1102, and the centerline of receiver 1201 are each parallel to the vectors (i.e.—the paths) of incident light. In other words, during solar concentration the rotatable parts of first embodiment are positioned such that, the focal line of left primary sheet 1101, the focal line of right primary sheet 1102, and the centerline receiver 1201 are each parallel to the solar azimuth. The first embodiment concentrates solar energy along a linear focus at receiver 1201, irrespective of the solar elevation angle.

During solar concentration, the positioning means orients the first embodiment such that the reflective side of left secondary sheet 1111 and the reflective side of right secondary sheet 1112 each face the sun. In the unfurled state, the reflective side of left secondary sheet 1111 and the reflective side of right secondary sheet 1112 are adjacent to, and face toward, left primary sheet 1101 and right primary. sheet 1102 respectively. In the unfurled state, the reflective side of left primary sheet 1101 and right primary sheet 1102 face upwards.

The reflective sheets of the first embodiment (left primary sheet 1101, right primary sheet 1102, left secondary sheet 1111, and right secondary sheet 1112) are used to reflect light towards receiver 1201. FIG. 2 shows one of the various ways that a typical light ray incident from the sun can be reflected to the receiver 1201. The light ray indicated by the ray trace 'S', is shown striking the right primary sheet 1102 at a location with normal 'N' (i.e.—the location where the line 'N' is perpendicular to right primary sheet 1102). The light ray indicated by ray trace 'S' is reflected by right primary sheet 1102 to the path indicated by ray trace 'R'. Light travelling along the path indicated by ray trace 'R' intersects with receiver 1201. In this manner right primary sheet 1102 reflects (and concentrates) a multitude of incident light rays on the receiver 1201. In a similar manner to that described above, incident light may by reflected by left primary sheet 1101 towards the receiver 1201.

The above describes two ways that light rays may be directed to the receiver 1201 by a single reflection. The following describes various ways that light may be directed to the receiver 1201 after two reflections. Incident light may be reflected by left secondary sheet 1111 towards left primary sheet 1101 and thence reflected to receiver 1201. Incident light may be reflected by right secondary sheet 1112 towards right primary sheet 1102 and thence reflected to receiver 1201. Incident light may be reflected by left primary sheet 1101 towards left secondary sheet 1111 and thence reflected to receiver 1201. Incident light may also be reflected by right primary sheet 1102 towards right secondary sheet 1112 and thence to receiver 1201.

When in the unfurled state, left primary sheet 1101 assumes a "half-trough" shape, wherein the trough shape has a catenary cross section. When in the unfurled state, right primary sheet 1102 assumes a "half-trough" shape, wherein the trough shape has a catenary cross section. Left primary sheet 1101 and right primary sheet 1102 are symmetrical and, when unfurled, together comprise a shape that is a catenary trough. The catenary trough shape formed by left primary sheet 1101 and right primary sheet 1102 is sufficiently close in shape to a parabolic trough to achieve imaging in the manner described above. The receiver 1201 is located at the focal line of the approximate parabolic trough contour formed by left primary sheet 1101 and right primary sheet 1102.

Left primary sheet 1101 consists of a flexible sheet that, when unfurled and hung, forms along a catenary. contour by gravity. Right primary sheet 1102 consists of a flexible sheet that, when unfurled and hung, forms along a catenary contour by gravity. Left secondary sheet 1111 consists of a flexible sheet that, when unfurled and hung, forms in a vertical planar shape by gravity. Right secondary sheet 1112 consists of a flexible sheet that, when unfurled and hung, forms in a vertical planar shape by gravity.

Figure 6:
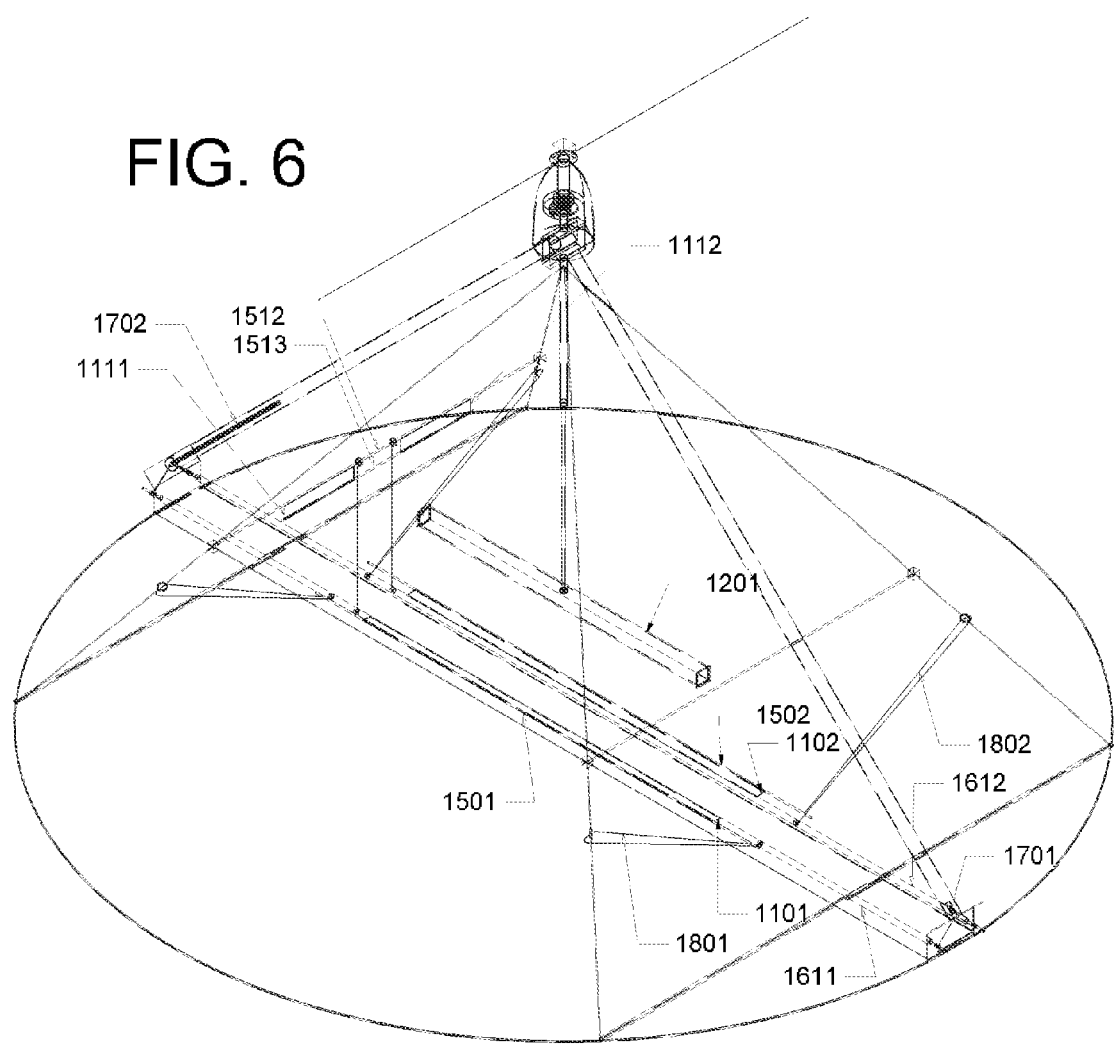
FIG. 6 shows the first embodiment of the invention when furled, as seen from above, with various parts numbered
Figure 6A:
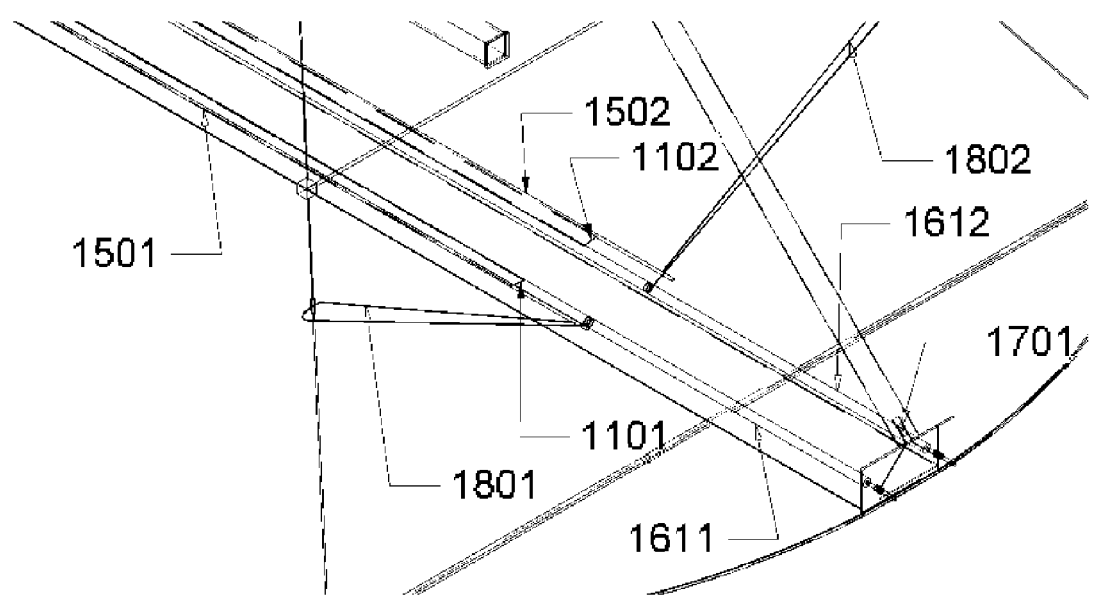
FIG. 6A shows various parts of FIG. 6 in detail

When the first embodiment is in an unfurled state as is shown in FIG. 1, 2, 3, 4, 5, the reflective sheets of the first embodiment reflect and concentrate light in the manner described above. When the first embodiment is in a furled state, as shown in FIG. 6, 7, the reflective sheets of the first embodiment are protected from exposure to wind, moisture, or dust. The first embodiment may be placed in a furled state by a furling means. The furling means of the first embodiment will now be described. Arrows of FIG. 5 indicate the direction of movement of various parts during furling.

Left primary spar 1501 is fixed to the upper edge of left primary sheet 1101. The lower edge of left primary sheet 1101 is fixed to left spool 1611. Left primary spar 1501 is fixed to left front cable 1801 and left rear cable 1803. Left front cable 1801 is threaded through left front eye 1531. Left rear cable 1803 is threaded through left rear eye 1533. During furling, left spool 1611 rotates in the direction indicated in FIG. 5, thus causing left front cable 1801 and left rear cable 1803 to unspool from left spool 1611 in unison, thus allowing left primary spar 1501 to lower, thus causing left primary sheet 1101 to wrap around left spool 1611.

Right primary spar 1502 is fixed to the upper edge of right primary sheet 1102. The lower edge of right primary sheet 1102 is fixed to right spool 1612. Right primary spar 1502 is fixed to right front cable 1802 and right rear cable 1804. Right front cable 1802 is threaded through right front eye 1532. Right rear cable 1804 is threaded through right rear eye 1534. During furling, right spool 1612 rotates in the direction indicated, thus causing right front cable 1802 and right rear cable 1804 to unspool from right spool 1612 in unison, thus allowing right primary spar 1502 to lower, thus causing right primary sheet 1102 to wrap around right spool 1612.

The diameter of left spool 1611 varies along its length. The section of left spool 1611 that is in contact with left primary sheet 1101 has a larger diameter than the section of left spool 1611 that is in contact with left front cable 1801 or left rear cable 1803. The variation of diameter mentioned above, allows left primary sheet 1101 to follow a slack, catenary profile when unfurled, and a wound, spooled profile when furled.

The diameter of right spool 1612 varies along its length. The section of right spool 1612 that is in contact with right primary sheet 1102 has a larger diameter than the section of right spool 1612 that is in contact with right front cable 1802 or right rear cable 1804. The variation of diameter mentioned above, allows right primary sheet 1102 to follow a slack, catenary profile when unfurled, and a wound, spooled profile when furled.

Rear upper secondary spar 1512 is supported by, and rotates in, left rear block 1543 and right rear block 1544. Rear upper secondary spar 1512 is fixed to the upper edge of left secondary sheet 1111. Rear upper secondary spar 1512 is fixed to the upper edge of right secondary sheet 1112. The lower edge of left secondary sheet 1111 is fixed to rear lower secondary spar 1513. The lower edge of right secondary sheet 1112 is fixed to rear lower secondary spar 1513. Left secondary cable 1821 is wrapped around left spool 1611 at one end, and rear upper secondary spar 1512 at the other end. Right secondary cable 1821 is wrapped around right spool 1612 at one end, and rear upper secondary spar 1512 at the other end. During furling, left spool 1611 and right spool 1612 rotate in the direction indicated in FIG. 5, thus causing left secondary cable 1821 to be spooled further onto left spool 1611 and right secondary cable 1822 to be spooled further onto right spool 1612, thus causing rear upper secondary spar 1512 to rotate in the direction indicated in FIG. 5, thus causing left secondary sheet 1111 and right secondary sheet 1112 to wrap further onto rear upper secondary spar 1512, thus causing rear lower secondary spar 1513 to rise.

In the manner above, the reflective parts of the first embodiment are spooled or wrapped protectively during furling. During furling, left primary sheet 1101 is spooled or wrapped onto left spool 1611. During furling, right primary sheet 1102 is spooled or wrapped onto right spool 1612. During furling, left secondary sheet 1111 is spooled or wrapped onto rear upper secondary spar 1512. During furling, right secondary sheet 1112 is spooled or wrapped onto rear upper secondary spar 1512.

In the above description of furling, front secondary spar 1511 was not described. Front secondary spar 1511 is supported by left front block 1541 and right front block 1542. Front secondary spar 1511 is not actuated during furling; rather it serves as a counter-weight to the assembly including rear upper secondary spar 1512, left secondary sheet 1111, right secondary sheet 1112, and rear lower secondary spar 1513. An important characteristic of the first embodiment is that it is balanced about the central vertical axis, which allows the first embodiment to be constructed from lightweight and inexpensive materials, and to be rotated easily about the central vertical axis by the positioning means. The centre of mass of the first embodiment lies on the central vertical axis. After furling, after unfurling, during furling, and during unfurling, substantially all parts of the first embodiment are either balanced about the central vertical axis of the first embodiment (e.g.—receiver 1201), or are mirror image and counter-weight to a corresponding part (e.g.—left primary sheet 1101 and right primary sheet 1102).

Furling of the first embodiment is actuated by a furling mechanism. The furling mechanism is a novel mechanism that does not exist in the prior art. The furling mechanism is shown in detail in FIG. 9A and FIG. 9B. Arrows of FIG. 9A and FIG. 9B indicate the direction of movement of various parts during furling. During furling, it can be said that left spool 1611 and right spool 1612 each move in a furling direction. During unfurling, it can be said that left spool 1611 and right spool 1612 each move in an unfurling direction. To actuate furling, the furling mechanism causes left spool 1611 and right spool 1612 to rotate in a furling direction. The furling mechanism will now be described.

The lower end of front bellows sleeve 1701 is fixed to support bracket 1601. The upper end of front bellows sleeve 1701 is fixed to front bellows cap 1711. Front bellows cap 1711 is fixed to the upper end of left front bellows cable 1831. Front bellows cap 1711 is fixed to the upper end of right front bellows cable 1832. The lower end of left front bellows cable 1831 is wrapped around left spool 1611. The lower end of right front bellows cable 1832 is wrapped around right spool 1612. Front bellows sleeve 1701 is pressure retaining, and filled with front bellows fluid 1731, which is a saturated liquid/vapour mixture. Front bellows sleeve 1701 is housed inside front bellows housing 1721. Front bellows housing 1721 is partially transparent such that light transmits through the front bellows housing 1721 when it is rotated to a position between the central vertical axis and the sun (i.e.—the position required for solar concentration).

The lower end of rear bellows sleeve 1702 is fixed to support bracket 1601. The upper end of rear bellows sleeve 1702 is fixed to rear bellows cap 1712. Rear bellows cap 1712 is fixed to the upper end of left rear bellows cable 1833. Rear bellows cap 1712 is fixed to the upper end of right rear bellows cable 1834. The lower end of left rear bellows cable 1833 is wrapped around left spool 1611. The lower end of right rear bellows cable 1834 is wrapped around right spool 1612. Rear bellows sleeve 1701 is pressure retaining, and filled with rear bellows fluid 1731, which is a saturated liquid/vapour mixture. Rear bellows sleeve 1702 is housed inside rear bellows housing 1722, which is opaque to solar rays.

As can be seen from the description above, front bellows sleeve 1701 and rear bellows sleeve 1702 are each connected, via cables, to the left spool 1611 and right spool 1612. An extension of front bellows sleeve 1701 causes a contraction of rear bellows sleeve 1702, as well as an unfurling rotation in left spool 1611 and right spool 1612. A retraction of front bellows sleeve 1701 allows an expansion of rear bellows sleeve 1702, and causes a furling rotation in left spool 1611 and right spool 1612. Thus it can be said that the front bellows sleeve 1701 and rear bellows sleeve 1702 are linked to the left spool 1611 and right spool 1612 in an offset configuration.

In the first embodiment, the front bellows fluid 1731 and the rear bellows fluid 1732 each consist of butane. Butane is useful in the application as it is a commonly available fluid that is saturated at low pressure at the near ambient operating temperatures of front bellows sleeve 1701 and rear bellows sleeve 1702. When the front bellows fluid 1731 is at a higher temperature than the rear bellows fluid 1732, the vapour pressure inside front bellows sleeve 1701 exceeds the vapour pressure inside the rear bellow sleeve 1702, and the upward force exerted on front bellows cap 1711 exceeds the upward force exerted on rear bellows cap 1712. In such a condition, the flexible front bellows sleeve 1702 is thus extended upwards, thus causing left front bellows cable 1831 to rotate left spool 1611 in an unfurling direction and right front bellows cable 1832 to turn right spool 1612 in an unfurling direction, thus causing left rear bellows cable 1833 to further wrap around left spool 1611 and right rear bellows cable 1844 to further wrap around right spool 1612, thus causing the flexible rear bellows sleeve 1712 to compress. Thus the first embodiment is unfurled.

When the temperature of the front bellows fluid 1701 decreases to the temperature of the rear bellows fluid 1702, furling occurs. When front bellows fluid 1731 and rear bellows fluid 1732 are at the same temperature, the upward force exerted on front bellows cap 1711 equals the upward force exerted on rear bellows cap 1712, and the furling mechanism imparts no net torque to left spool 1611 and right spool 1612. In such a circumstance, the left spool 1611 and right spool 1612 tend to rotate in a furling direction, due to the tendency of the left primary spar 1501 and right primary spar 1502 to lower by gravity. Thus the first embodiment is furled.

It is seen from the above that unfurling occurs when front bellows sleeve 1701 is heated to a higher temperature than rear bellows sleeve 1702. Conversely, furling occurs when front bellows sleeve 1701 approaches the same temperature as rear bellows sleeve 1702. The factors that cause the temperature of front bellows sleeve 1701 and the temperature of rear bellows sleeve 1702 to vary, or to become equal, will now be described.

When the positioning means adjusts the position of the first embodiment to achieve solar concentration, front bellows housing 1721 transmits solar rays to front bellows sleeve 1701, and rear bellows sleeve 1702 may also become shaded by the front bellows sleeve 1701. Thus the front bellows sleeve 1701 absorbs substantially more solar rays than the rear bellows sleeve 1702, thus the front bellows sleeve 1701 is heated to a higher temperature than rear bellow sleeve 1702, thus unfurling is actuated.

When the first embodiment is turned away from the position necessary for solar concentration either deliberately or by wind, or when the first embodiment is shaded by clouds (e.g.—during the approach of rainy weather), or when the first embodiment is exposed to the night sky, solar rays are not transmitted by front bellows housing 1721 to front bellows sleeve 1701, thus the front bellows sleeve 1701 and the rear bellows sleeve 1702 become close in temperature, thus furling is actuated. It is an important characteristic of the first embodiment that furling may be initiated by the environmental factors (i.e.—wind, clouds) that would tend to damage unfurled reflectors.

Figure 8A:
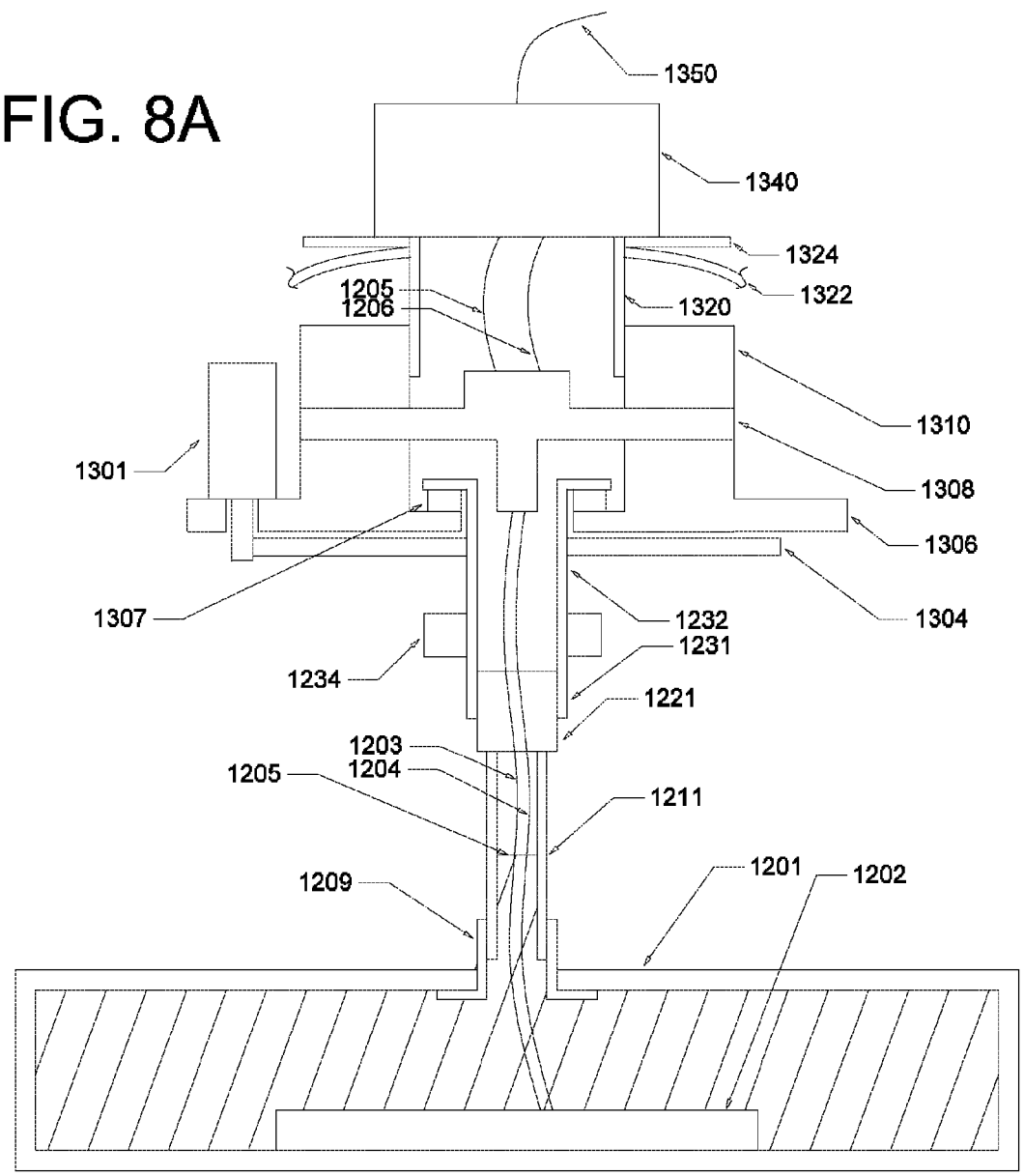
FIG. 8A shows a conceptual section of parts related to the receiver and positioning means of the first embodiment, with various parts numbered

The solar concentration function of the first embodiment has been described above. The furling of the first embodiment has been described above. The furling mechanism of the first embodiment has been described above. Details of the novel solar collection means of the first embodiment will now be described. The solar collection means is a novel component of the first embodiment, that does not exist in the prior art. The solar collection means includes a photovoltaic cell, and a means for cooling the photovoltaic cell, thus improving the service life and efficiency of the photovoltaic cell. The solar collection means is shown in detail in FIG. 8A.

As described above, solar rays are concentrated on the receiver 1201 along a line focus. Receiver 1201 consists of a pressure retaining boundary that is transparent. Enclosed inside receiver 1201 is a photovoltaic cell 1202. Photovoltaic cell 1202 is immersed in receiver fluid 1205, which is a saturated liquid/vapour mixture. Receiver fluid 1205 consists of butane. Butane is useful in the application as it is a commonly available transparent, non-conductive, non-corrosive fluid that is saturated at low pressure at the operating temperatures of receiver 1201. Such a receiver fluid 1202 will neither degrade, nor electrically short the photovoltaic cell 1202; nor will it over-pressurize the receiver 1201. Solar rays that are concentrated on the receiver 1201 pass through the transparent boundary of receiver 1201, then pass through the transparent liquid fraction of receiver fluid 1205, and are then absorbed by photovoltaic cell 1202. Solar energy absorbed by photovoltaic cell 1202 is converted to electricity and heat. Heat is dissipated from the photovoltaic cell 1202 by receiver fluid 1205. Heat transferred from the photovoltaic cell 1202 vaporizes receiver fluid 1205. Vapour bubbles thus generated rise upward out of receiver 1201 through receiver port 1209, thence upwards through the saturated liquid fraction of receiver fluid 1205, thence upwards into the vapour region of receiver heat pipe 1211. Receiver heat pipe 1211 is sufficiently conductive and sufficiently long to conduct the heat of condensation of vapor generated in the manner described above to ambient. Droplets formed on the receiver heat pipe 1211 interior wall, drip by gravity downwards to the saturated liquid fraction of receiver fluid 1205, Thus heat generated at photovoltaic cell 1202 is transferred to the ambient.

Positive wire 1203 and negative wire 1204 conduct electrical current to equipment in electrical circuit with photovoltaic cell 1202. Cable gland 1221 is a pressure retaining component of the pressure retaining envelope of receiver 1201. Positive wire 1203 and negative wire 1204 pass through the pressure retaining boundary of receiver 1201 at cable gland 1221. Positive wire 1203 and negative wire 1204 interface with various components integrated with the positioning means and the supporting means of the first embodiment. The positioning means and supporting means will now be described. Parts of the positioning means and supporting means are shown in detail in FIG. 8A. Parts of the positioning means and supporting means are also shown in FIG. 4A.

Together first support cable 1331 and second support cable 1332 bear the weight of the entire first embodiment. First support cable 1331 is connected at one end to a fixed point above ground, and at its other end to support bracket 1324. Second support cable 1331 is connected at one end to a fixed point above ground, and at its other end to support bracket 1324. Support tube 1320 is fixed to support bracket 1324 at its upper end, and to upper support plate 1310 at its lower end. Upper support plate 1310 is bolted and fixed to lower support plate 1306. Slip ring 1308 is sandwiched between upper support plate 1310 and lower support plate 1306. First support cable 1331, second support cable 1332, support bracket 1324, support tube 1320, upper support plate 1310, and lower support plate 1306 are components of the supporting means. All parts below lower support plate 1306 are rotatable about the central vertical axis of the first embodiment.

Thrust bearing 1307 sits in a recessed area of lower support plate 1306. A lip of upper drive shaft 1232 sits on the thrust bearing 1307 and may rotate about the central vertical axis of the first embodiment. The central vertical axis of the first exemplary embodiment is concentric with support bracket 1324, upper support plate 1310, lower support plate 1306, and upper drive shaft 1232. Mounting pad 1234 joins the upper drive shaft 1232 and the lower drive shaft 1231 to the front bellows housing 1721 and the rear bellows housing 1722. The lower drive shaft 1231 is continuous with, and connected to the upper drive shaft 1232; both parts rotate about the central vertical axis of the first exemplary embodiment in unison when rotated by the positioning means, Motor 1301 is a main component of the positioning means. Motor 1301 is mounted to lower support plate 1306 and includes a drive gear that meshes with gear 1304. Gear 1304 is fixed to lower drive shaft 1231. To position rotating parts to achieve solar concentration, upper drive shaft 1232 and lower drive shaft 1231 are rotated by gear 1304 which is rotated by motor 1301. The lower drive shaft 1231 supports cable gland 1221. Cable gland supports heat pipe 1211 which in turn supports receiver 1201. Cover 1322 is fixed to support tube 1320 and shelters various parts of the positioning means and supporting means from weather.

A ballast assembly comprising ballast ring 1401, front ballast beam 1402 and rear ballast beam 1403, and support bracket 1601 is used to tension various stay cables of the first embodiment. The stay cables are used to support unfurled reflective sheets and parts of the furling mechanism. Front left stay cable 1521 is fixed at its upper end to lower drive shaft 1231 and at its lower end to ballast ring 1401. Front left stay cable 1521 is held taught by the ballast assembly. Front left stay cable 1521 supports left front eye 1531 and left front block 1541. In a similar manner, due to gravity tensioning by the ballast assembly, front right stay cable 1522 supports right front eye 1532 and right front block 1542. In a similar manner, rear left stay cable 1523 supports left rear eye 1533 and left rear block 1543. In a similar manner, rear right stay cable 1524 supports right rear eye 1534 and right rear block 1544. All stay cables are connected at their upper end to lower drive shaft 1231.

Positive wire 1203 and negative wire 1204 each connect electrically to slip ring 1308. Slip ring 1308 is a rotary electrical joint that conducts current from rotating positive wire 1203 and rotating negative wire 1204 to stationary positive wire 1205 and stationary negative wire 1206 respectively.

Stationary positive wire 1205 and stationary negative wire 1206 are routed to electrical junction box 1340. Junction box 1340 is supported by support bracket 1324. Inside junction box 1340, stationary negative wire 1206 are connected to main electrical cable 1350, which delivers current to external equipment in electrical circuit with photovoltaic cell 1202.

The above explanation describes the solar concentration means, the furling means, the furling mechanism, the balancing of parts about the central vertical axis, the immersed photovoltaic heat pipe receiver design, the supporting means, the positioning means, the ballast tensioning of various parts, and the general function of the first embodiment. The secondary embodiment is similar to the first embodiment with respect to the concentration, furling, balance, receiver design, and ballast. The positioning means of the secondary embodiment differs from that of the first embodiment. The secondary embodiment includes a plurality of ganged elements wherein each ganged element is similar to the first embodiment, and all ganged elements are positioned by a common positioning means. The second embodiment will now be described with reference to FIG. 10.

Three elements of the ganged array of the second exemplary embodiment are shown. The first element includes reflective sheets as follows: element 1 left primary sheet 21101, element 1 right primary sheet 21102, element 1 left secondary sheet 21111, and element 1 right secondary sheet 21112. The second element includes reflective sheets as follows: element 2 left primary sheet 22101, element 2 right primary sheet 22102, element 2 left secondary sheet 22111, and element 2 right secondary sheet 22112. The third element includes reflective sheets as follows: element 3 left primary sheet 23101, element 3 right primary sheet 23102, element 3 left secondary sheet 23111, and element 3 right secondary sheet 23112.

Element 1 upper drive shaft 21232 is rotated by the common positioning means to locate element 1 in a position necessary for solar concentration on element 1 receiver 21201. Element 2 upper drive shaft 22232 is rotated by the common positioning means to locate element 2 in a position necessary for solar concentration on element 2 receiver 22201. Element 3 upper drive shaft 23232 is rotated by the common positioning means to locate element 3 in a position necessary for solar concentration on element 3 receiver 23201.

The common positioning means adjusts front common cable 20901 and rear common cable 20902. Front common cable 20901 and rear common cable 20902 are connected to, and provide support to, element 1 positioning link 21911. Front common cable 20901 and rear common cable 20902 rotate element 1 positioning link 21911, which is fixed to element 1 upper drive shaft 21232, thus movement of front common cable 20901 and rear common cable 20902 causes element 1 to rotate. Front common cable 20901 and rear common cable 20902 are connected to, and provide support to, element 2 positioning link 22911. Front common cable 20901 and rear common cable 20902 rotate element 2 positioning link 22911, which is fixed to element 2 upper drive shaft 22232, thus movement of front common cable 20901 and rear common cable 20902 causes element 2 to rotate. Front common cable 20901 and rear common cable 20902 are connected to, and provide support to, element 3 positioning link 23911. Front common cable 20901 and rear common cable 20902 rotate element 3 positioning link 23911, which is fixed to element 3 upper drive shaft 23232, thus movement of front common cable 20901 and rear common cable 20902 causes element 3 to rotate. During solar concentration, front common cable 20901 and rear common cable 20902 cause each of element 1 positioning link 21911, element 2 positioning link 22911, and element 3 positioning link 23911, to be parallel.

Element 3 main electrical cable 23350 conducts current generated by element 3. Element 3 main electrical cable 23350 conducts current from element 3 electrical junction box 23340 to element 2 electrical junction box 22340. Element 2 main electrical cable 22350 conducts current generated by element 2 and element 3. Element 2 main electrical cable 22350 conducts current from element 2 electrical junction box 22340 to element 1 electrical junction box 21340. Element 1 main electrical cable 21350 conducts current generated by element 1, element 2 and element 3. Element 1 main electrical cable 21350 delivers electrical current from element 1 electrical junction box 21340 to external equipment.

Figure 11:
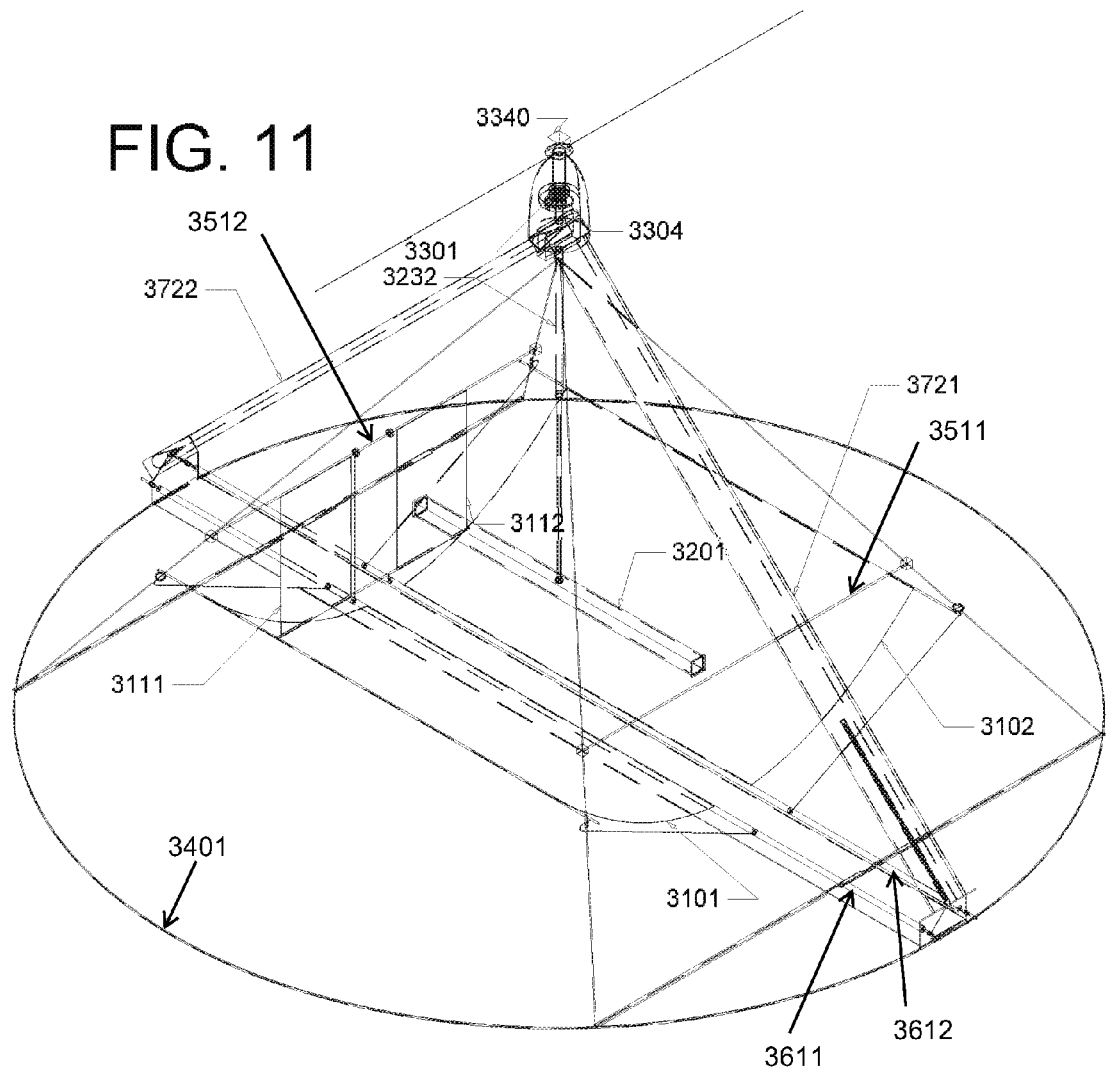
FIG. 11 shows the third embodiment of the invention including turbine blades for wind power generation, as seen from above, with various parts numbered
Figure 12:
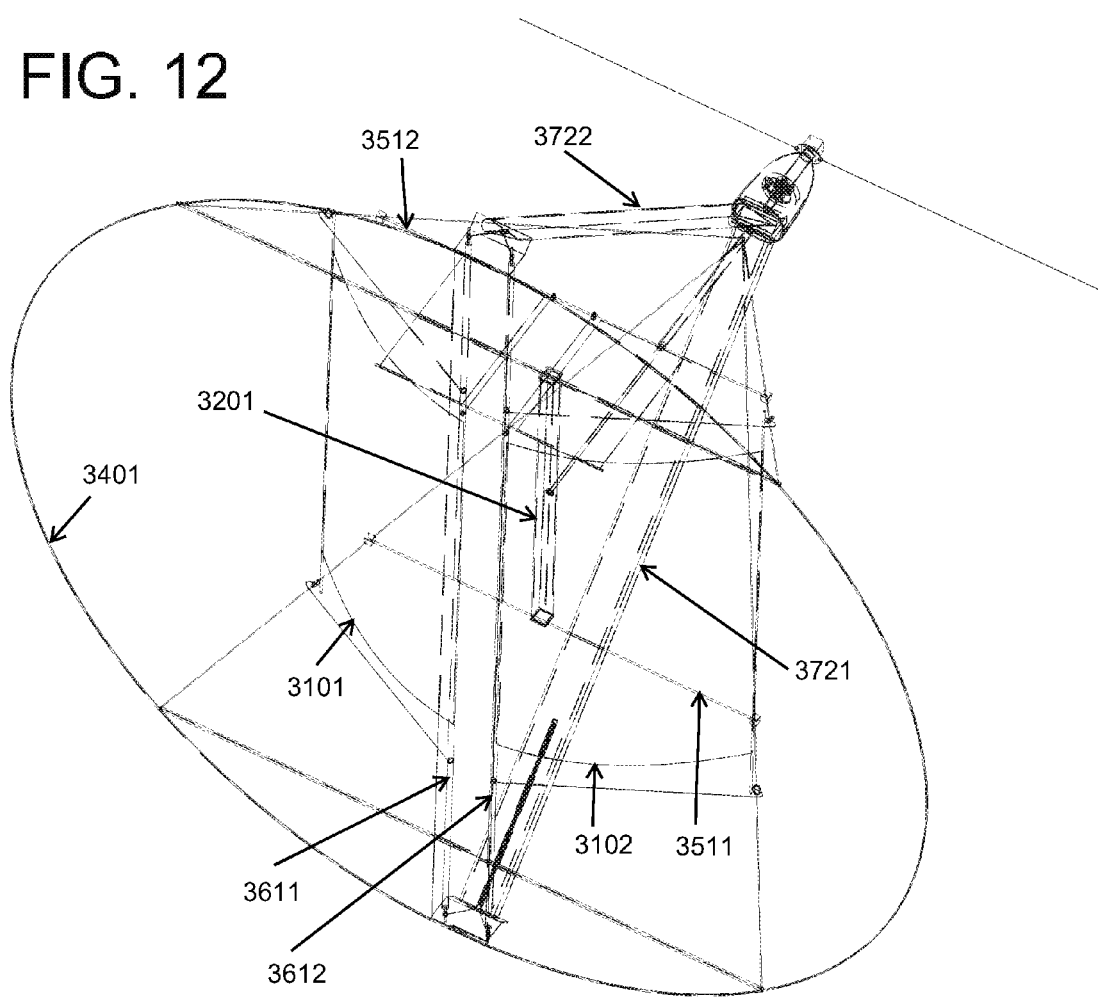
FIG. 12 shows the third embodiment of the invention including turbine blades for wind power generation, as seen from an alternate location above

The third embodiment, when furled, is capable of converting wind energy to electricity. The third embodiment will now be described with reference to FIG. 11 and FIG. 12.

The third embodiment can collect solar energy in a similar manner to the first embodiment. The third embodiment can furl to protect reflective sheets in a similar manner to the first embodiment. The third embodiment is identical to the first embodiment with the exception of its motor, its bellows housings, and its ability to convert wind energy to electrical energy. The motor 3301 of the third embodiment can convert electrical current to mechanical rotation (similar to the motor of the first embodiment), but it may also convert mechanical rotation to electrical current; thus the part is referred to as motor/generator 3301. Front bellows housing 3721 and rear bellows housing 3722 are each congruent aerofoil shapes. The shape of front bellows housing 3721, when rotated 180 degrees about the central vertical axis of the third embodiment, is geometrically identical to the shape of rear bellows housing 3722. In windy conditions, when the third exemplary embodiment is furled, the front bellows housing 3721 and rear bellows housing 3722 act together as a lift type rotor similar to those of a Darrieus rotor. In windy conditions, the third embodiment behaves as a vertical axis wind turbine (VAWT).

In windy conditions, rotation induced by aerodynamic forces imparted to front bellows housing 3721 and rear bellows housing 3722 cause upper drive shaft 3232 to rotate, thus causing gear 3304 to rotate, thus causing motor/generator 3301 to rotate, thus causing motor/generator 3301 to generate electricity. Cables from motor/generator 3301 deliver electrical current to an external device, thus wind energy is converted to useful electrical energy.

The first embodiment and fourth embodiment are identical in all respects, with the exception of the primary sheets and the furling cables and spars related to furling of primary sheets. In the first embodiment, a reflective catenary trough reflector is accomplished by two symmetrical primary sheets. In the fourth embodiment, a reflective catenary trough reflector is accomplished by one symmetrical primary sheet. The fourth embodiment will now be described with reference to FIG. 13A and FIG. 13B.

Figure 13A:
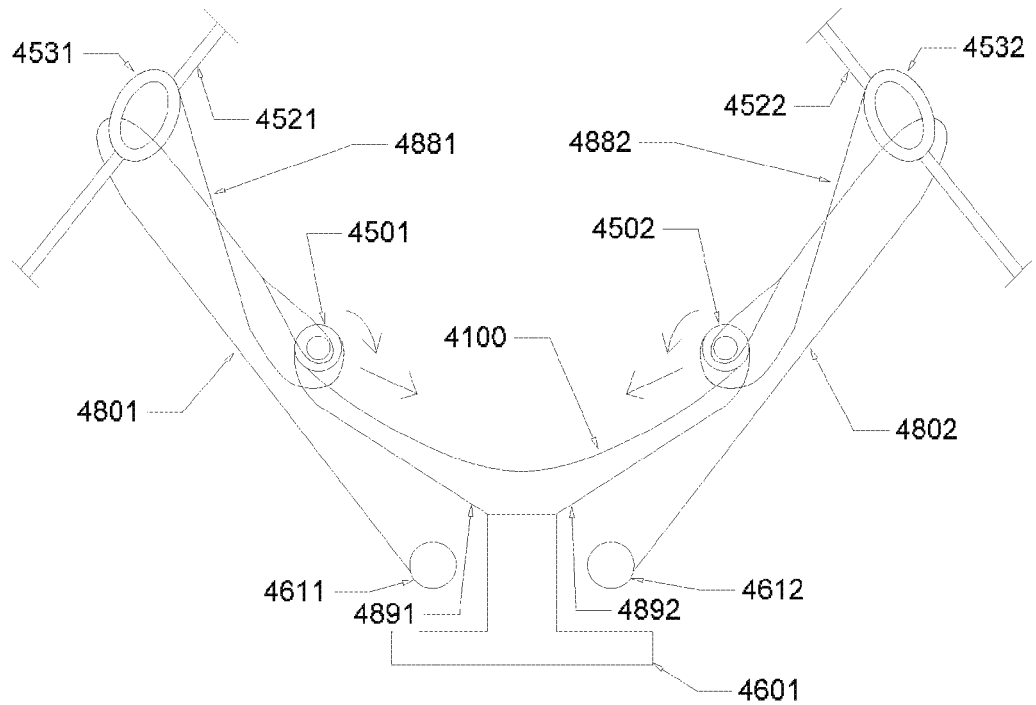
FIG. 13A shows a conceptual section of parts of the fourth embodiment that are related to furling
Figure 13B:
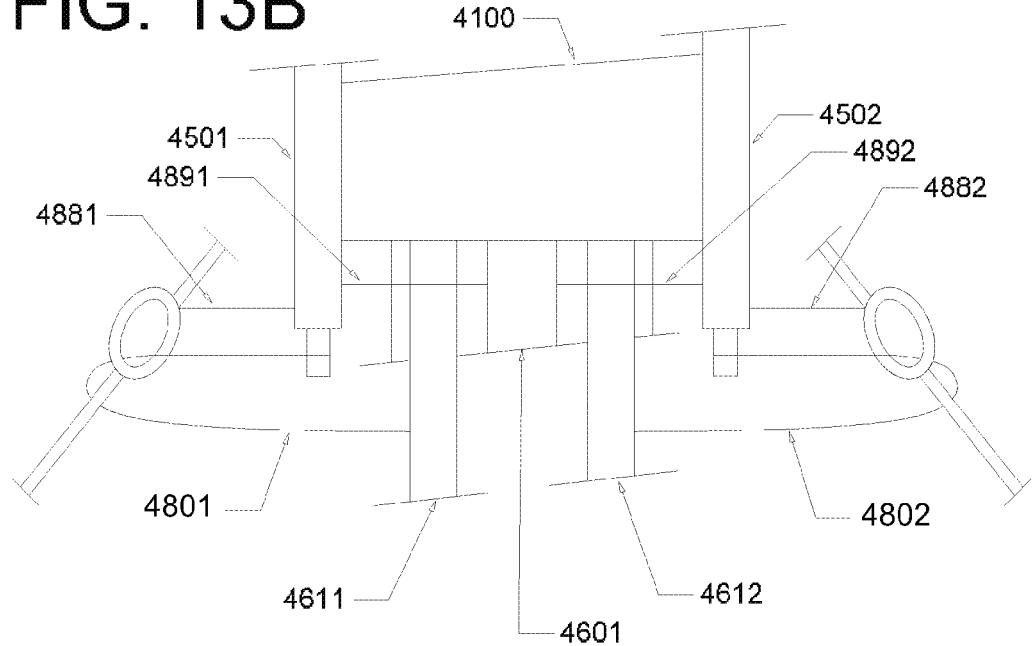
FIG. 13B shows a conceptual plan view of parts of the fourth embodiment that are related to furling

FIG. 13A shows primary sheet 4100 connected to left primary spar 4501 and right primary spar 4502, The primary sheet 4100 connects neither to left spool 4611, nor right spool 4612. Arrows in FIG, 13A indicate the movement of various parts during furling. For clarity, cables are shown slackened (though they would be taut in normal use). During furling, one end of primary sheet 4100 wraps onto left primary spar 4501, and its other end onto right primary spar 4502. During furling, left primary spar 4501 lowers and rotates in the direction indicated. During furling, right primary spar 4502 lowers and rotates in the direction indicated. The means by which left primary spar 4501 and right primary spar 4502 are lowered and rotated will now be described.

Left primary spar 4501 is lowered when left front cable 4801, which is threaded through left front eye 4531, is unspooled from left spool 4611. Right primary spar 4502 is lowered when right front cable 4802, which is threaded through right front eye 4532, is unspooled from right spool 4612.

The top end of left top spar cable 4881 is fixed to front left stay cable 4521, its other end is spooled onto left primary spar 4501. The bottom end of left bottom spar cable 4891 is fixed to support bracket 4601, its other end is spooled onto left primary spar 4501. As left primary spar 4501 is lowered, it must rotate to become unspooled of left top spar cable 4881. As left primary spar 4501 lowers and rotates, left bottom spar cable 4891 is spooled onto left primary spar 4501. Thus the left primary spar 4501 lowers and rotates, and by a reverse operation, is raised and rotated in an opposite direction. Since left primary spar 4501 translates, which is typical of spars, and furls, which is typical of spools, it may be referred to as left translating spool 4501. Such a translating spool is different from the non-translating spools of the first embodiment.

The top end of right top spar cable 4882 is fixed to front right stay cable 4522, its other end is spooled onto right primary spar 4502. The bottom end of right bottom spar cable 4892 is fixed to support bracket 4601, its other end is spooled onto right primary spar 4502. As right primary spar 4502 is lowered, it must rotate to become unspooled of right top spar cable 4882. As right primary spar 4502 lowers and rotates, right bottom spar cable 4892 is spooled onto right primary spar 4502, Thus the right primary spar 4502 lowers and rotates, and by a reverse operation, is raised and rotated in an opposite direction. Since right primary spar 4502 translates, which is typical of spars, and furls, which is typical of spools, it may be referred to as right translating spool 4501. Such a translating spool is different from the non-translating spools of the first embodiment.

As can be seen from the claims, alternative embodiments of the invention exist that are varied from the exemplary embodiments described above. Some features of alternate embodiments, differing from the exemplary embodiments described above, and consistent with the claims below, will now be described.

Variations to the solar concentration means will now be described.

In the embodiments described above, the reflective sheets are flexible. Some flexible reflective sheets that may be used include aluminized films, silvered films, aluminized/silvered films, aluminum sheet, etc.

Each of the embodiments described employs a pair of secondary reflective sheets. Other embodiments may include one, two, more than two, or no secondary reflective sheets.

In the first embodiment, a solar receiver receives solar energy along the line focus of the primary sheets. In other embodiments, a reflective or refracting element may reflect or refract light at the line focus of the primary sheets to other optical elements. One example of such a device would include a "tertiary" inverted parabolic trough element at the line focus of the primary sheets. Light reflected by the "tertiary" parabolic trough element would be collimated. Light reflected by the "tertiary" parabolic trough element could be reflected by a rotating "quaternary" parabolic strip element to a point focus. In such a device, a point focus version of the immersed photovoltaic heat pipe receiver could be used.

In the first embodiment, each primary sheet comprised a single flexible sheet reflective element. In other embodiments, each primary sheet may comprise several flexible sheet reflective elements.

Variations to the furling means will now be described.

In the first embodiment, left spool and right spool are each cylindrical rotating elements. In other embodiments, left spool and right spool may each be rotating annular bushings that are each mounted on stationary shafts. In other embodiments, the secondary upper spar may be a rotating annular bushing, mounted on a stationary shaft.

In the first embodiment, eyes are used to guide various cables. In other embodiments, pulleys may be used.

In the first embodiment, cables are used to link and synchronize various moving parts of the furling means. In some alternative embodiments, belts may synchronize various moving parts of the furling means. In some alternate embodiments, gears may synchronize the left spool and right spool.

In some alternate embodiments, the device may be fabricated to easily furl, disassemble, stow, and transport after temporary use.

In the first embodiment, the primary sheet was composed entirely of a reflective material. In other embodiments, the primary sheet may include a weatherproof, protective "outer-wrap" material in the vicinity of the primary spar(s), such that the protective "outer-wrap" covers the more delicate reflective material when the device is furled.

In each of the embodiments presented, furling reflective sheets are supported by a rotating frame that is hung from above. It is possible to apply the protective furling technique of the present invention to concentrators that are supported from underneath (e.g.—supported by the ground, the sea, a roof, etc.).

Variations to the furling mechanism will now be described.

In the first embodiment, left spool and right spool tend to rotate in a furling direction, due to the tendency of the left primary spar and right primary spar to lower by gravity. To unfurl, the furling mechanism must overcome the weight of left primary spar and right primary spar (only). In other embodiments, the furling mechanism must overcome the weight of additional counterweights and/or springs to unfurl. In some such other embodiments, the weight of the left and right spars may be minimized or eliminated (provided the primary surfaces have an edge seam strong enough to obviate the primary spars).

In the first embodiment, the front bellow sleeve and rear bellows sleeve are linked in an offset configuration. In other embodiments, the front bellows sleeve may not be offset by the rear bellows sleeve.

In the first embodiment, the front bellows housing is partially transparent such that light transmits through the front bellows housing when it is rotated to a position between the central vertical axis and the sun. In some embodiments of the device, this can be achieved by installing reflective blinds inside a fully transparent front bellows housing, such that the reflective blinds shade/reflect light from reaching the front bellows sleeve when it is not rotated to a position between the central vertical axis and the sun.

In the first embodiment, a novel furling mechanism was employed. In other embodiments, furling may be initiated manually, or by a motorized means.

In some alternate embodiments, the left spool and right spool can be locked in a furled or unfurled position, with pins, clips, locks, or the like, thus immobilizing the furling mechanism hourly, daily, seasonally, or as required.

In the embodiments described above, the bellows fluid is a saturated liquid/vapour mixture. A saturated liquid/vapour mixture in a closed volume undergoes significant change in pressure in response to changes in temperature. The pressure of a closed volume of a saturated liquid/vapour mixture is more greatly affect by temperature changes than a closed volume of a gas. In theory a gas could be used as bellows fluid; in practice this may not be feasible.

In the firs embodiment, the front bellows sleeve and rear bellows sleeve each have an accordion shape. In other embodiments, the front bellows sleeve and the rear bellows sleeve may have a (flexible) sock shape.

Variations to the immersed photovoltaic heat pipe receiver design will now be described.

In the embodiments described above, an immersed photovoltaic heat pipe receiver was used, thus allowing inexpensive photovoltaic cells to be employed in a solar concentration application. In other embodiments, the receiver assembly may comprise high concentration photovoltaics (HCPV); which is suitable for operation at the high temperatures caused by concentrated light (i.e.—no heat removal system required).

In the first embodiment, the photovoltaic cell was housed inside a tubular receiver enclosure. In other embodiments, the photovoltaic cell may be housed inside an inexpensive "bag type" enclosure that has been formed by fusing two sheets along their periphery.

In the first embodiment, the photovoltaic cell was housed inside a tubular receiver enclosure with a single port for connection to the heat pipe. In alternate embodiments, the tubular receiver enclosure may include multiple ports for connect to the heat pipe. In some such alternate embodiments, the tubular receiver enclosure may include a port at either end.

In some alternate embodiments, the receiver enclosure may be supplemented with clear UV protective optical elements, or the receiver enclosure itself may be designed to block transmission of UV light to the photovoltaic cell.

In the embodiments presented above, the receiver fluid was butane. In other embodiments, alternate receiver fluids that are substantially optically transparent, non-conductive, and saturated at the temperatures of operation of the receiver may be used. The receiver fluid may include additives to mitigate oxidation, improve optical qualities, etc.

In the embodiments described above, the receiver and heat pipe are distinct. In other embodiments, the receiver may be sufficiently conductive and large to serve as both receiver and heat pipe.

Variations to the supporting means will now be described.

In the first embodiment, the receiver is supported by the lower drive shaft. In other embodiments, the receiver may be supported by the stay cables or other rotating parts.

In each of the embodiments described above, the only cables connecting the device to external supports were above the device (i.e.—first support cable and second support cable). In other embodiments, stabilizing wires installed below the device may connect the device to a rotating part fixed to the ground, to maintain the central axis of the device in a vertical orientation (e.g.—during high wind).

In the first embodiment the device is supported from above. In the first embodiment, the device employs a drive shaft to rotate and support reflective sheets. In other embodiments, the device may employ a drive means to rotate and support reflective sheets, wherein the drive means conforms to some shape other than a shaft (e.g.—a plurality of cables that support and rotate reflective sheets from above, etc.). In other embodiments the device may be supported from underneath. When supported from underneath, some embodiments may employ a drive shaft (for rotating and supporting reflective sheets). When supported from underneath, some embodiments may employ a drive means (for rotating and supporting reflective sheets), wherein the drive means conforms to some shape other than a shaft, such as a wheel mounted carriage, etc. When supported from underneath on a wheel mounted carriage drive means, it is possible for the drive means to cause the central vertical axis to translate (in addition to its regular function of causing reflective surfaces to rotate about the central vertical axis).

To differentiate the function of the two systems, the drive means and the positioning means may be referred to separately. It is sometimes useful to refer to the drive means and positioning means collectively as the positioning means, to describe the components of the device related to single-axis tracking generically.

Variations to the ballast will now be described.

In the embodiments describe above, the bellows housings and the stay cables were tensioned by ballast assemblies. In other embodiments, some or all of the bellows housings and stay cables stay "members") may be rigid components of a rigid frame.

In the first embodiment, the ballast assembly includes a ballast ring, a front ballast beam, a rear ballast beam, and a support bracket. In other embodiments, the ballast assembly may comprise fewer parts, or a single part. The ballast assembly need not include a circular part similar to the ballast ring.

Variations to the ganged embodiment will now be described.

Figure 10:
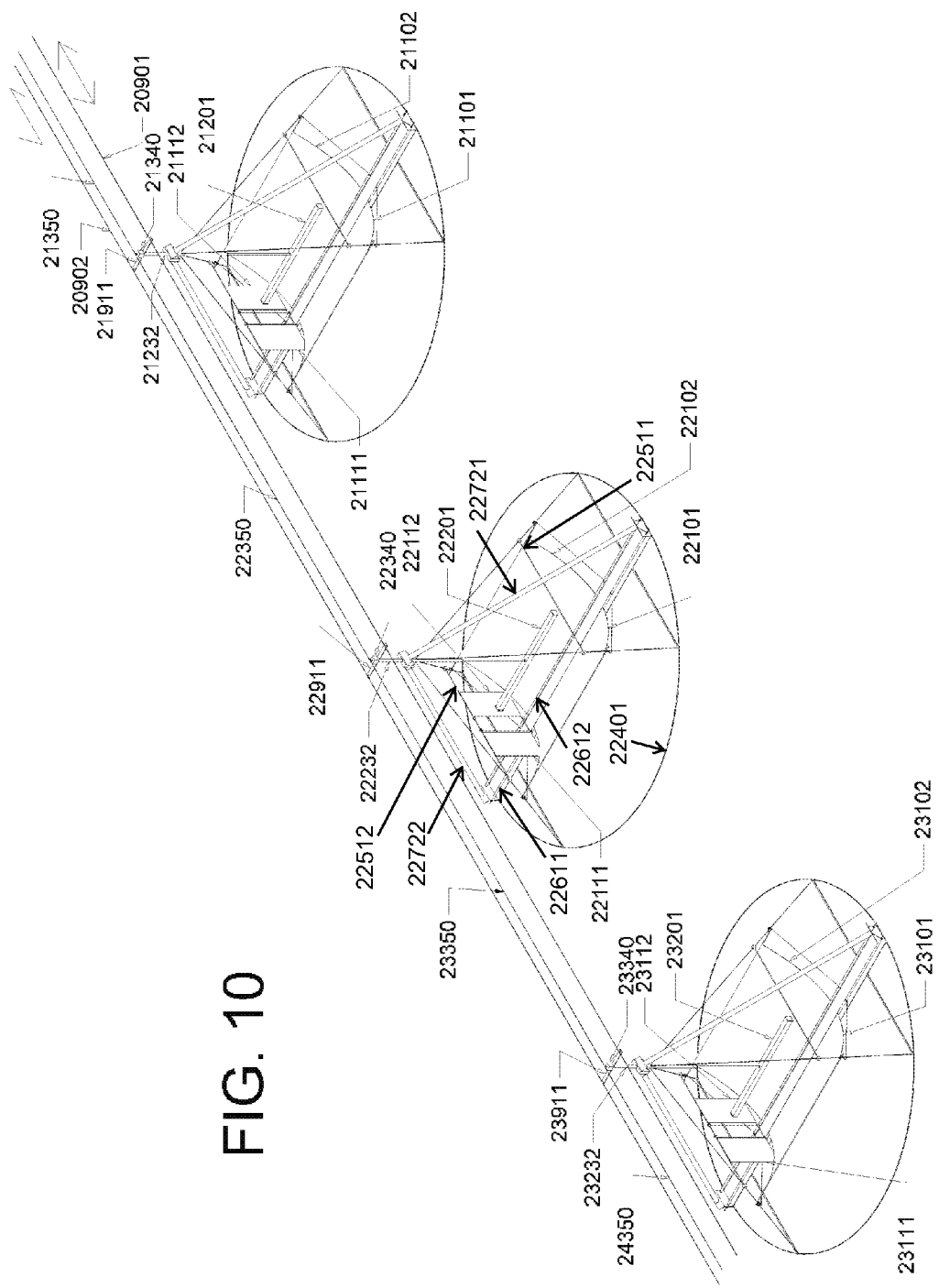
FIG. 10 shows the second embodiment of the invention in a ganged configuration, as seen from above

The common cables of the common positioning means are shown taut in FIG. 10. In other embodiments, the common cables may follow catenary curves.

The elements of the ganged array of the second embodiment are linked by common positioning cables only. In other embodiments, additional linking cables may link the ganged elements (e.g.—ballast linkage cables, receiver linkage cables, etc.).

In the ganged embodiment presented, the position of the reflective surfaces of an element of the ganged array was adjusted by the rotation of the stay cables, which were adjusted by the rotation of the drive shaft, which was adjusted by the movement of the front common cable and rear common cable. In other embodiments, the left common cable and rear common cable may support reflective surfaces more directly (e.g.—obviating the drive shaft and/or other parts related to the drive shaft).

Variations to the wind energy collection means will now be described.

The third embodiment employs a motor/generator. Other embodiments may include a separate motor and generator.

The third embodiment employs darrieus rotor "lift type" blades. In other embodiments, the device may include darrieus "lift type" turbine blades and/or savonius "drag type" turbine blades.

The supporting structure of the third embodiment, which is capable of wind energy collection, is typically stronger and more expensive that the support structure that would be required for devices typical of the first embodiment, which is not capable of wind energy collection and not exposed to large wind loads. When considering an implementation similar to the third embodiment, the additional benefit of wind energy collection must be weighed against the increased frame cost.

I claim:

1. A device for terrestrial use for collecting solar energy, comprising:
   a lightweight reflector frame that is capable of being rotated about a central vertical axis; and
   one of more primary spools that are each supported by said reflector frame; and
   a furling actuator; and
   a trough reflector comprising one or more primary reflective sheets,
   wherein each of said one or more primary reflective sheets is capable of being protectively furled by being substantially fully wrapped on said one or more primary spools by virtue of linkage to said furling actuator,
   wherein each of said one or more primary reflective sheets is capable of being unfurled from said one or more primary spools by virtue of linkage to said furling actuator to expose reflective surface area along a catenary curve by gravity,
   wherein during unfurling the rate of unfurling of said primary reflective sheets differs from the rate of translation of translatable edges of said primary reflective sheets,
   wherein said one or more primary spools comprise one or more translating spools capable of being translated relative to said reflector frame or said one or more primary spools comprise one or more non-translating spools that are not translatable relative to said reflector frame,
   wherein said trough reflector reflects concentrated light rays along a line focus rotating in unison with said reflector frame.

2. The device of claim 1 wherein one or more translatable edges of each of said primary reflective sheets are capable of being translated to achieve furling by virtue of linkage to said furling actuator, wherein one or more furlable edges of each of said primary reflective sheets are capable of being wrapped to achieve furling by virtue of linkage to said furling actuator.

3. The device of claim 1 wherein substantially all parts of the device are balanced about said central vertical axis.

4. The device of claim 1 wherein substantially all parts of the device are balanced about said central vertical axis throughout the travel of said furling actuator.

5. The device of claim 1 wherein the device is implemented as an element in a ganged array, wherein a common positioner adjusts the position of all elements of said ganged array in unison.

6. The device of claim 5 wherein said furling actuator is common to all elements of said ganged array.

7. The device of claim 1 wherein said reflector frame is suspended above the earth and substantially fully supported from above.

8. The device of claim 1 comprising:
one or more secondary spools that are each supported by said reflector frame; and
a planar reflector comprising one or more secondary reflective sheets wherein each of said secondary reflective sheets is capable of being substantially fully wrapped on one or more of said secondary spools, wherein each of said secondary reflective sheets is capable of being unfurled to expose surface area in a planar shape, wherein light reflected by said planar reflector towards said trough reflector is reflected by said trough reflector to said line focus, wherein light reflected by said trough reflector towards said planar reflector is reflected by said planar reflector to said line focus.

9. The device of claim 8 wherein each of said secondary reflective sheets is capable of being substantially fully wrapped on one or more of said secondary spools by virtue of linkage to said furling actuator.

10. A device for terrestrial use for collecting solar energy, comprising:
one or more rotating reflectors; and
a furling actuator frame; and
a front bellows housing that is mounted to said furling actuator frame wherein said front bellows housing transmits solar radiation when said rotating reflectors are rotated to a position for solar concentration; and
a front bellows sleeve that is flexible and housed inside said front bellows housing; and
a front bellows fluid that is contained inside said front bellows sleeve for expanding said front bellows sleeve when heated and for contracting said front bellows sleeve when cooled,
wherein said furling actuator frame is rotated in unison with said rotating reflectors, wherein said rotating reflectors are capable of being protectively furled and unfurled by virtue of linkage to said front bellows sleeve, wherein said rotating reflectors reflect light onto a focus.

11. The device of claim 10 wherein said front bellows fluid is a saturated liquid/vapour mixture.

12. The device of claim 10 comprising:
a rear bellows housing that is mounted to said furling actuator frame; and
a rear bellows sleeve that is flexible and housed inside said rear bellows housing; and
a rear bellows fluid that is contained inside said rear bellows sleeve, wherein said front bellows sleeve and said rear bellows sleeve are linked in an offset configuration.

13. The device of claim 12 wherein said front bellows fluid and said rear bellows fluid are identical in composition.

14. The device of claim 1, comprising:
a receiver that is located at said line focus and substantially transparent to light rays; and
a receiver fluid that is substantially optically transparent to said light rays and substantially non-conductive to electrical current and enclosed inside said receiver; and
a photovoltaic cell that is enclosed inside said receiver and immersed in said receiver fluid for converting said light rays to electrical current and for delivering electrical current to an external electrical circuit; and
a heat pipe that forms an enclosure with said receiver,
wherein said light rays are transmitted through said receiver and thence through said receiver fluid to said photovoltaic cell, wherein heat generated at said photovoltaic cell is absorbed by said receiver fluid, wherein said receiver fluid discharges heat at surfaces of said heat pipe.

15. The device of claim 14 wherein said receiver fluid is a saturated liquid/vapour mixture, wherein heat generated at said photovoltaic cell is absorbed by vapourizing bubbles of said receiver fluid, wherein vapour of said receiver fluid condenses at surfaces of said heat pipe.

16. The device of claim 14 wherein said receiver fluid is a non-polar organic compound.

17. The device of claim 14 wherein said receiver fluid is not externally circulated outside of said receiver, wherein said receiver fluid is confined to said receiver.

* * * * *